| (12) | United States Patent | (10) Patent No.: | US 9,195,152 B2 |
|---|---|---|---|
| | Soer et al. | (45) Date of Patent: | Nov. 24, 2015 |

(54) SPECTRAL PURITY FILTER, LITHOGRAPHIC APPARATUS, AND METHOD FOR MANUFACTURING A SPECTRAL PURITY FILTER

(75) Inventors: Wouter Anthon Soer, Nijmegen (NL); Andrei Mikhailovich Yakunin, Eindhoven (NL); Martin Jacobus Johan Jak, Eindhoven (NL); Denny Mathew, Eindhoven (NL); Hendrik Jan Kettelarij, Eindhoven (NL); Fredericus Christiaan Van Den Heuvel, Waalre (NL); Petrus Elizabeth Maria Kuijpers, Bergeijk (NL)

(73) Assignee: ASML NETHERLANDS B.V., Veldhoven (NL)

( * ) Notice: Subject to any disclaimer, the term of this patent is extended or adjusted under 35 U.S.C. 154(b) by 514 days.

(21) Appl. No.: 13/119,895

(22) PCT Filed: Aug. 26, 2009

(86) PCT No.: PCT/EP2009/006194
§ 371 (c)(1),
(2), (4) Date: Mar. 18, 2011

(87) PCT Pub. No.: WO2010/034385
PCT Pub. Date: Apr. 1, 2010

(65) Prior Publication Data
US 2011/0164237 A1    Jul. 7, 2011

Related U.S. Application Data

(60) Provisional application No. 61/136,702, filed on Sep. 26, 2008, provisional application No. 61/193,769, filed on Dec. 22, 2008.

(51) Int. Cl.
*G03B 27/72* (2006.01)
*G03F 7/20* (2006.01)
(Continued)

(52) U.S. Cl.
CPC .............. *G03F 7/7095* (2013.01); *B82Y 10/00* (2013.01); *G02B 5/208* (2013.01); *G03F 7/70191* (2013.01); *G03F 7/70575* (2013.01); *G21K 1/10* (2013.01); *G21K 2201/061* (2013.01)

(58) Field of Classification Search
CPC ........... G03F 7/70191; G03F 7/70575; G03F 7/70958
USPC .......................... 355/71, 53; 359/634; 385/27
See application file for complete search history.

(56) References Cited

U.S. PATENT DOCUMENTS

| 6,014,251 A | 1/2000 | Rosenberg et al. |
|---|---|---|
| 7,031,566 B2 | 4/2006 | Kochergin et al. |

(Continued)

FOREIGN PATENT DOCUMENTS

| JP | 2006-191090 | 7/2006 |
|---|---|---|
| JP | 2010-21543 | 1/2010 |

OTHER PUBLICATIONS

International Search Report for PCT International Patent Application No. PCT/EP2009/006194, mailed Dec. 18, 2009.

(Continued)

*Primary Examiner* — Peter B Kim
(74) *Attorney, Agent, or Firm* — Pillsbury Winthrop Shaw Pittman LLP

(57) ABSTRACT

A transmissive spectral purity filter is configured to transmit extreme ultraviolet radiation. The spectral purity filter includes a filter part having a plurality of apertures configured to transmit extreme ultraviolet radiation and to suppress transmission of a second type of radiation. Each aperture has been manufactured by an anisotropic etching process.

6 Claims, 20 Drawing Sheets

(51) Int. Cl.
  *B82Y 10/00* (2011.01)
  *G02B 5/20* (2006.01)
  *G21K 1/10* (2006.01)

(56) References Cited

U.S. PATENT DOCUMENTS

| | | |
|---|---|---|
| 7,453,645 B2 | 11/2008 | Klunder et al. |
| 8,536,551 B2 | 9/2013 | Moriya et al. |
| 2004/0004779 A1* | 1/2004 | Kochergin et al. ............ 359/885 |
| 2006/0146413 A1 | 7/2006 | Klunder et al. |
| 2007/0170379 A1 | 7/2007 | Watson et al. |
| 2008/0017945 A1* | 1/2008 | Wu et al. ...................... 257/440 |
| 2010/0226655 A1* | 9/2010 | Kim .............................. 398/139 |

OTHER PUBLICATIONS

DuPont Kapton HN Polymide Film, Dupont De Nemours, obtained from url: <http://www2.dupont.com/Kapton/en_US/assets/downloads/pdf/HN_datasheet.pdf>.

Soer et al., "Grid spectral purity filters for suppression of infrared radiation in laser-produced plasma EUV sources", Proceedings of SPIE, vol. 7271, Feb. 24, 2009, pp. 72712Y-1-72712Y-9.

* cited by examiner

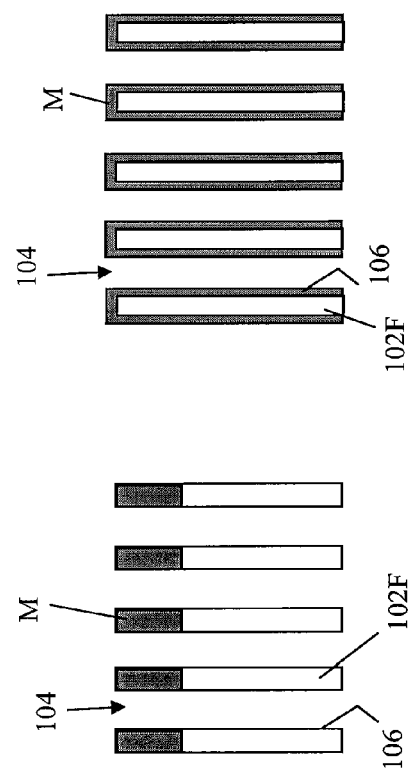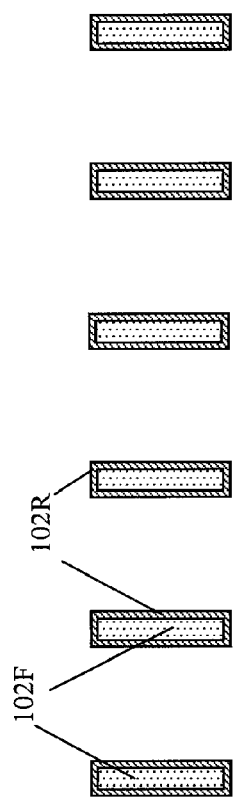
FIG. 9A
FIG. 9B
FIG. 10A

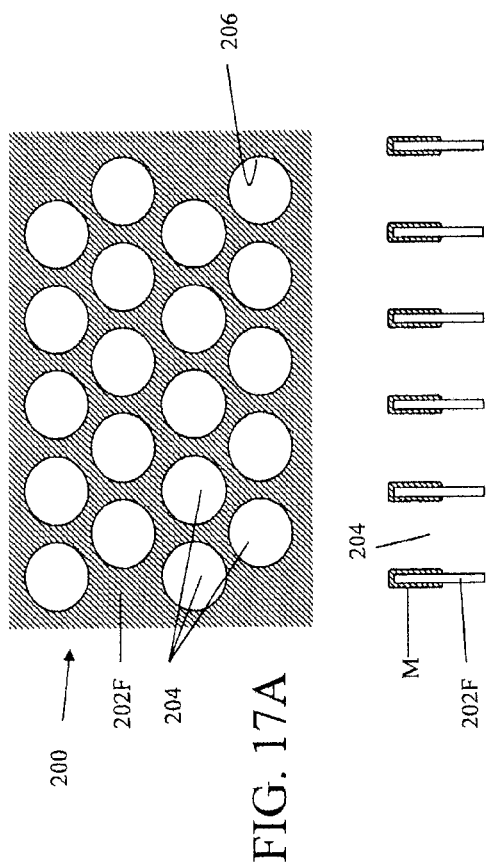
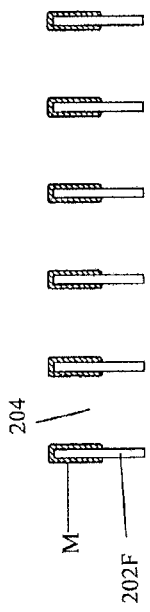
FIG. 17A
FIG. 17B

SPECTRAL PURITY FILTER, LITHOGRAPHIC APPARATUS, AND METHOD FOR MANUFACTURING A SPECTRAL PURITY FILTER

CROSS REFERENCE TO RELATED APPLICATIONS

This application is the U.S. National Phase entry of International Patent Application No. PCT/EP2009/006194, filed Aug. 26, 2009, which claims the benefit of U.S. provisional application 61/136,702, filed on Sep. 26, 2008 and U.S. provisional application 61/193,769, filed on Dec. 22, 2008, both of which provisional applications are incorporated herein in their entirety by reference.

FIELD

The present invention relates to spectral purity filters, lithographic apparatus including such spectral purity filters, and methods for manufacturing spectral purity filters.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet (EUV) radiation which is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm.

EUV sources based on a Sn plasma do not only emit the desired in-band EUV radiation but also out-of-band radiation, most notably in the DUV range (100-400 nm). Moreover, in the case of Laser Produced Plasma (LPP) EUV sources, the radiation from the laser, usually at 10.6 μm, presents a significant amount of unwanted radiation. Since the optics of the EUV lithographic system generally have substantial reflectivity at these wavelengths, the unwanted radiation propagates into the lithography tool with significant power if no measures are taken.

In a lithographic apparatus, out-of-band radiation should be minimized for several reasons. Firstly, resist is sensitive to out-of-band wavelengths, and thus the image quality may be deteriorated. Secondly, unwanted radiation, especially the 10.6 μm radiation in LPP sources, leads to unwanted heating of the mask, wafer and optics. In order to bring unwanted radiation within specified limits, spectral purity filters (SPFs) are being developed.

Spectral purity filters can be either reflective or transmissive for EUV radiation. Implementation of a reflective SPF requires modification of an existing mirror or insertion of an additional reflective element. A transmissive SPF is typically placed between the collector and the illuminator and does not affect the radiation path, which is an advantage because it results in flexibility and compatibility with other SPFs.

Grid SPFs form a class of transmissive SPFs that may be used when the unwanted radiation has a much larger wavelength than the EUV radiation, for example in the case of 10.6 μm radiation in LPP sources. Grid SPFs contain apertures with a size of the order of the wavelength to be suppressed. The suppression mechanism may vary among different types of grid SPFs as described in the prior art and detailed embodiments further in this document. Since the wavelength of EUV radiation (13.5 nm) is much smaller than the size of the apertures (typically >3 μm), EUV radiation is transmitted through the apertures without substantial diffraction.

A further challenge with existing spectral purity filters is that they change the direction of the light from the EUV source. Therefore, if a spectral purity filter is removed from an EUV lithography apparatus, a replacement spectral purity filter should be added or a mirror at a proper angle should be introduced. The added mirror introduces unwanted losses into the system.

U.S. patent application publication no. 2006/0146413 discloses a spectral purity filter (SPF) comprising an array of apertures with diameters up to 20 μm. Depending on the size of the apertures compared to the radiation wavelength, the SPF may suppress unwanted radiation by different mechanisms. If the aperture size is smaller than approximately half of the wavelength, the SPF reflects virtually all radiation of this wavelength. If the aperture size is larger, but still of the order of the wavelength, the radiation is at least partially diffracted and may be absorbed in a waveguide inside the aperture.

Several prior art spectral purity filters (SPFs) rely on a grid with micron-sized apertures to suppress unwanted radiation. The approximate material parameters and specifications for these SPFs are known. However, a successful manufacturing method has not been described so far. Manufacturing is not straightforward at these specifications. The most challenging specifications are: apertures of typically 4 μm in diameter; a grid thickness of typically 5-10 μm; very thin (typically <1 μm) and parallel (non-tapered) walls between the apertures to ensure maximal EUV transmission.

U.S. Pat. No. 7,031,566 B2 discloses a filter, wherein the transmission spectrum is optimized by introducing at least one layer of substantially transparent dielectric material on the pore walls. The publication describes a method for the fabrication of the spectral filters, the method including: taking a semiconductor wafer having first and second surfaces wherein said first surface is substantially flat, producing a porous layer in the wafer starting from the first surface, coating the pore walls with at least one layer of transparent material, and subsequently removing the un-etched part of the wafer that remains under the porous layer. U.S. Pat. No. 7,031,566 B2 proposes to apply a transparent coating on the sidewalls of the pores for waveguiding of the desired wavelength.

SUMMARY

It is an aspect of the present invention to provide an EUV spectral purity filter which improves the spectral purity of a radiation beam and is less difficult to manufacture. According to an embodiment of the present invention, there is provided a transmissive spectral purity filter configured to transmit extreme ultraviolet radiation, the spectral purity filter comprising a filter part having a plurality of apertures configured to transmit the extreme ultraviolet radiation and to suppress transmission of a second type of radiation, wherein each aperture has been manufactured by an anisotropic etching process. Optionally, the filter may include a metal or reflective layer. Alternatively or additionally, the filter may be provided with an integral filter holder. The etching process may be a deep reactive ion etching process. The filter may be configured to provide at most 5% infrared (IR) transmission. The filter part may contain one or more semiconductor materials which may be selected from the group consisting of Silicon, Germanium, Diamond, Gallium Arsenide, Zinc Selenide, and Zinc Sulfide.

Also, according to an embodiment, there is provided a spectral purity filter configured to filter extreme ultraviolet radiation from radiation generated by a radiation source. The spectral purity filter includes a filter part comprising silicon (Si) and having a thickness of about 10 µm, and a plurality of apertures in the filter part, each aperture being defined by a substantially vertical and textured sidewall.

According to an embodiment of the invention, there is provided a transmissive spectral purity filter, the spectral purity filter comprising a filter part comprising polyimide, the filter part having a plurality of apertures to transmit extreme ultraviolet radiation and to suppress transmission of a second type of radiation.

According to an embodiment of the present invention, there is provided a spectral purity filter configured to filter extreme ultraviolet radiation from radiation generated by a radiation source. The spectral purity filter includes a filter part comprising polyimide and having a thickness of about 10 µm, a plurality of apertures in the filter part, each aperture being defined by a sidewall, and a metal layer disposed on top of the filter part and on at least a portion of each sidewall.

According to an embodiment of the present invention, there is provided a lithographic apparatus that includes a radiation source configured to generate radiation comprising extreme ultraviolet radiation, a illumination configured to condition the radiation into a beam of radiation, and a support configured to support a patterning device. The patterning device is configured to pattern the beam of radiation. The apparatus also includes a projection system configured to project a patterned beam of radiation onto a target material, and a spectral purity filter configured to filter the extreme ultraviolet radiation from the radiation. The spectral purity filter includes a filter part comprising silicon and having a thickness of about 10 µm, and a plurality of apertures in the filter part, each aperture being defined by a substantially vertical and textured sidewall.

According to an embodiment of the present invention, there is provided a lithographic apparatus that includes a radiation source configured to generate radiation comprising extreme ultraviolet radiation, a illumination configured to condition the radiation into a beam of radiation, and a support configured to support a patterning device. The patterning device is configured to pattern the beam of radiation. The apparatus also includes a projection system configured to project a patterned beam of radiation onto a target material, and a spectral purity filter configured to filter the extreme ultraviolet radiation from the radiation. The spectral purity filter includes a filter part comprising polyimide and having a thickness of about 10 µm, a plurality of apertures in the filter part, each aperture being defined by a sidewall, and a metal layer disposed on top of the filter part and on at least a portion of each sidewall.

According to an embodiment of the present invention there is provided a method for manufacturing a transmissive spectral purity filter, the method comprising etching a plurality of apertures in a substrate using an anisotropic etching process. Preferably, the filter is configured to transmit extreme ultraviolet radiation. The method may comprise depositing a metal or reflective layer on top of the substrate, the metal or reflective layer optionally comprising Molybdenum or Ruthenium. The metal or layer may be deposited utilizing Atomic Layer Deposition and/or the etching process may comprise alternately exposing the substrate to an $SF_6$ plasma and a Fluor Carbon plasma. Apertures having hexagonal cross-sections may be etched in the substrate.

According to an embodiment of the present invention, there is provided a method for manufacturing a spectral purity filter. The method includes etching a plurality of apertures in a silicon substrate using deep reactive ion etching. The silicon substrate has a thickness of about 10 µm, and the apertures have diameters of about 3 µm to about 4 µm. The etching creates substantially vertical and textured sidewalls that define the apertures.

According to an embodiment of the present invention, there is provided a method for manufacturing a spectral purity filter. The spectral purity filter may be transmissive. The method includes micromachining a polyimide substrate with a laser to create a plurality of apertures. The polyimide substrate may have a thickness of about 10 µm, and the apertures have diameters of about 4 µm. The micromachining creates substantially vertical sidewalls that define the apertures. The method may include depositing a metal or reflective layer on top of the substrate.

BRIEF DESCRIPTION OF THE DRAWINGS

Embodiments of the present invention will now be described, by way of example only, with reference to the accompanying schematic drawings in which corresponding reference symbols indicate corresponding parts, and in which:

FIG. 9A depicts a schematic view of a cross section of a spectral purity filter in accordance with an embodiment of the present invention;

FIG. 9B depicts a schematic view of a cross section of a spectral purity filter in accordance with an embodiment of the present invention;

FIG. 10A depicts a schematic view of a cross section of a spectral purity filter in accordance with an embodiment of the present invention;

FIGS. 17a and 17b depict a spectral purity filter in accordance with an embodiment of the present invention;

DETAILED DESCRIPTION

Figure 1:
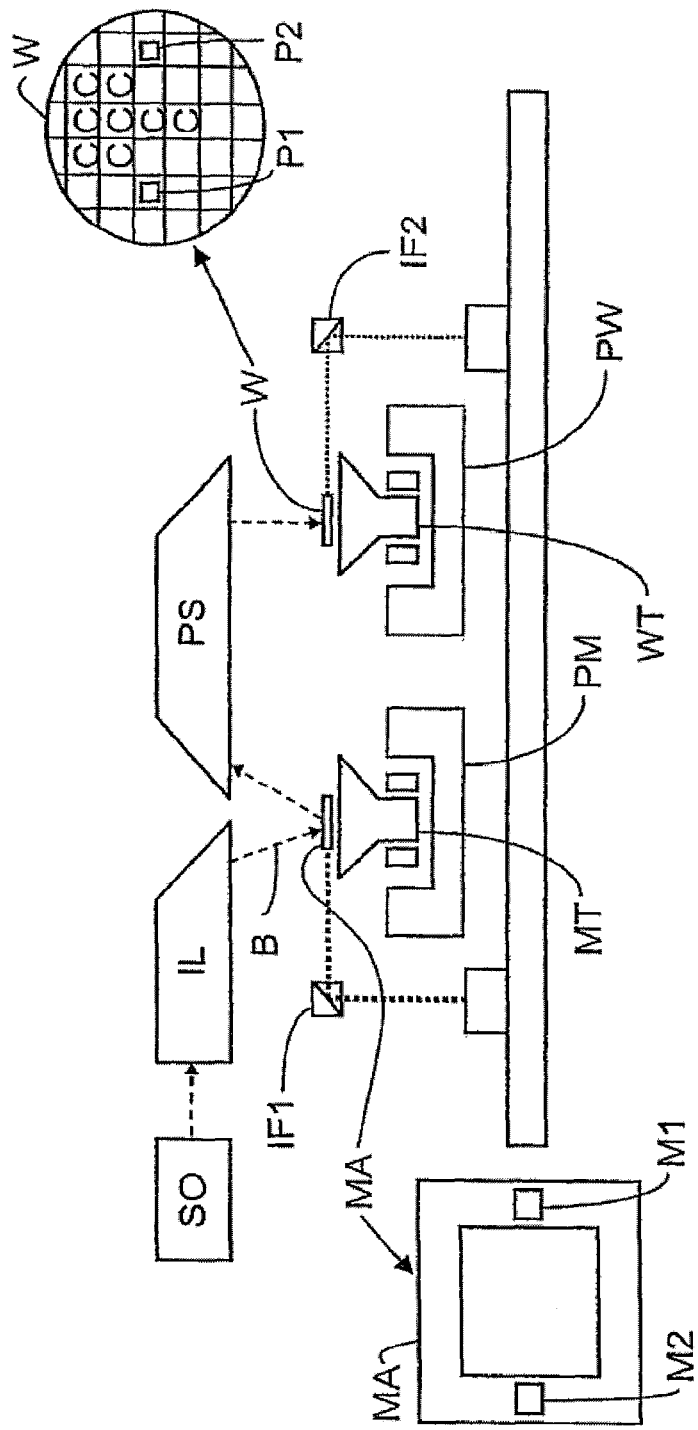
FIG. 1 depicts a lithographic apparatus according to an embodiment of the present invention.

FIG. 1 schematically depicts a lithographic apparatus. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may also be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2B:
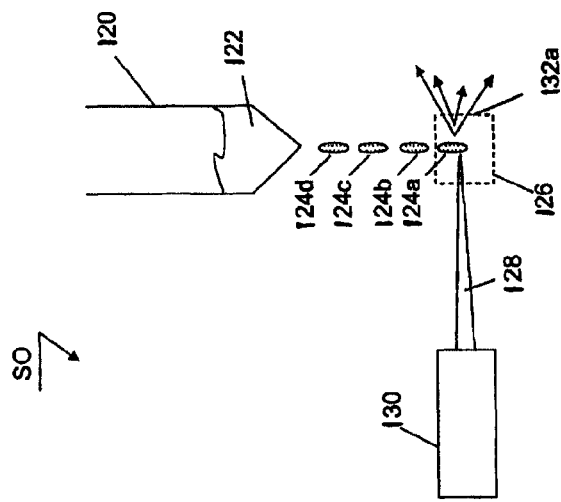
FIG. 2B depicts an embodiment of a radiation source of the lithographic apparatus of FIG. 1.
Figure 2A:
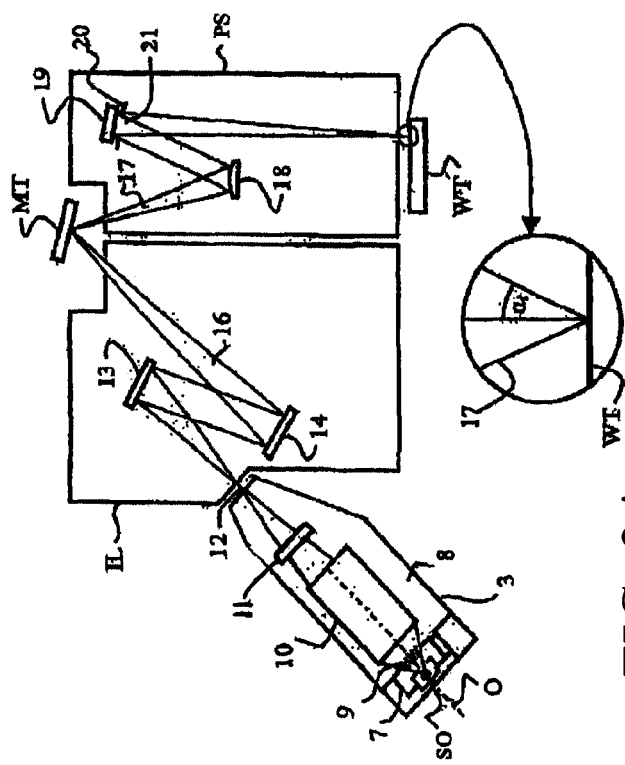
FIG. 2A depicts a lithographic apparatus according to an embodiment of the present invention.

FIG. 2A shows a side view of an EUV lithographic apparatus in accordance with an embodiment of the present invention. It will be noted that, although the arrangement is different to that of the apparatus shown in FIG. 1, the principle of operation is similar. The apparatus includes a source-collector-module or radiation unit 3, an illumination system IL and a projection system PS. Radiation unit 3 is provided with a radiation source SO which may employ a gas or vapor, such as for example Xe gas or Li vapor in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of 0.1 m bar of Xe, Li vapor or any other suitable gas or vapor may be required for efficient generation of the radiation. The radiation emitted by radiation source SO may be passed from the source chamber 7 into collector chamber 8 via a gas barrier or "foil trap" 9. The gas barrier includes a channel structure such as, for instance, described in detail in U.S. Pat. Nos. 6,614,505 and 6,359,969, which are incorporated herein by reference. The collector chamber 8 may include a radiation collector 10 which is formed, for example, by a grazing incidence collector. Alternatively, the apparatus can include a normal incidence collector for collecting the radiation.

Also, for example, the apparatus can include a LPP radiation source. An example of an LPP source is depicted in FIG. 2B. For example, the LPP source SO may comprise a beam generator 130 configured to generate a radiation beam 128 of radiation, particularly coherent radiation, to be used to produce a radiation output 132a of the radiation source SO. In the present embodiment, the beam generator 130 is a laser, configured to emit a laser beam 128. For example, operation of the LPP source SO may be part of a device manufacturing method. The method can include generating a first type of radiation 132a (i.e., the radiation output, for example EUV radiation), utilizing the beam 128 of a second type of radiation (for example infrared laser light), projecting a patterned beam of the first type of radiation onto a substrate W.

More particularly, as follows from FIG. 2B, the LPP source SO may comprise a fuel supplier 120 configured to supply a plasma fuel to a fuel ignition location 126. The source SO may comprise a laser 130 configured to emit a laser beam 128 to ignite fuel, present at the ignition location 126, to generate radiation emitting plasma Q (see FIGS. 4-5).

As follows from FIG. 2B, the radiation source SO may be configured to focus at least part of the laser beam 128 onto a focus spot 126 (the focus spot being the aforementioned fuel ignition location). Also, the radiation source SO may comprise a fuel supplier 120, 122 configured to supply the plasma fuel 124 to the fuel ignition location 126. For example, the radiation source SO may comprise a container 120 arranged with a liquefied target material 122 (i.e. plasma fuel), for example with Sn or Gd. The container 120 may be arranged with a suitable mechanism or opening (not shown) for delivery of liquid droplets 124 of Sn or Gd to the region 126 (i.e. the ignition location) wherein a droplet is configured to be impinged by the laser beam 128 provided by the laser 130. The laser beam 128 may relate to a $CO_2$ laser having a respective (infrared) wavelength, for example 10.6 micrometer or 9.4 micrometer. Alternatively, other suitable lasers may be used, for example having respective wavelengths in the range of 1-11 micrometers. The laser beam 128 is desirably focused in the region 126 using a suitable optical system examples. Upon interaction with the laser beam 128, the droplets 124 are transferred into plasma state which may emit, for example, 6.7 nm radiation, or any other EUV radiation selected from the range of 5-20 nm, or a different type of radiation.

Radiation passed by collector 10 (see FIG. 2A) transmits through a spectral purity filter 11 according to the present invention. It should be noted that in contrast to blazed spectral purity filters, the spectral purity filter 11 does not change the direction of the radiation beam. Preferred examples of the filter 11 are described below.

In an alternative embodiment, not shown, the spectral purity filter 11 may reflect the radiation beam as the spectral purity filter 11 may be implemented in the form of a grazing incidence mirror or on the collector 10.

The radiation is focused in a virtual source point 12 (i.e. an intermediate focus) from an aperture in the collection chamber 8. From chamber 8, the radiation beam 16 is reflected in illumination system IL via normal incidence reflectors 13,14 onto a reticle or mask positioned on reticle or mask table MT. A patterned beam 17 is formed which is imaged by projection system PS via reflective elements 18,19 onto wafer stage or substrate table WT. More elements than shown may generally be present in the illumination system IL and projection system PS. One of the reflective elements 19 has in front of it an NA disc 20 having an aperture 21 there-through. The size of the aperture 21 determines the angle $\alpha_i$ subtended by the patterned radiation beam 17 as it strikes the substrate table WT.

Figure 3:
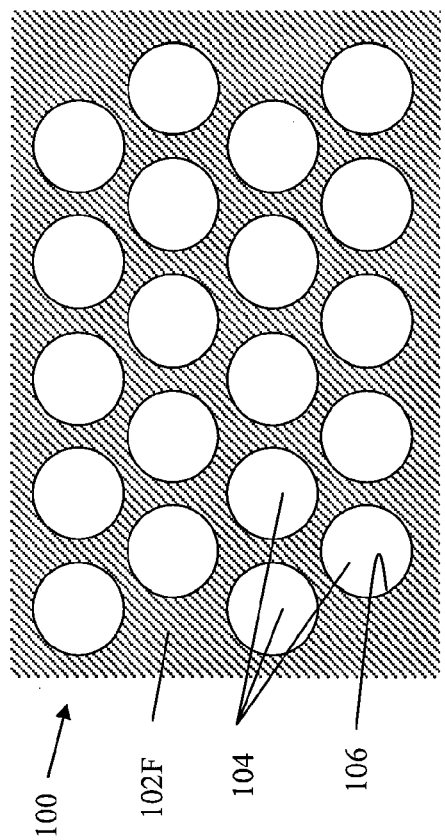
FIG. 3 depicts a spectral purity filter in accordance with an embodiment of the present invention.

FIG. 2A shows the spectral purity filter 11 according to present invention positioned downstream of the collector 10 and upstream of the virtual source point 12. In alternative embodiments, not shown, the spectral purity filters 11 may be positioned at the virtual source point 12 or at any point between the collector 10 and the virtual source point 12. FIG. 3 illustrates an embodiment of a spectral purity filter 100, that may for example be applied as an above-mentioned filter 11 of a lithographic apparatus. The present filter 100 is configured to transmit extreme ultraviolet (EUV) radiation. In a further embodiment, the filter 100 substantially blocks a second type of radiation generated by a radiation source, for example infrared (IR) radiation, for example infrared radiation that is having a wavelength larger than about 1 µm, particularly larger than about 10 µm. Particularly, the EUV radiation to be transmitted and the second type of radiation (to be blocked) can emanate from the same radiation source, for example an LPP source SO of a lithographic apparatus.

The spectral purity filter 100 preferably comprises a filter part 102F (for example a filter film or filter layer), as shown in FIG. 3. The filter part 102F as such can be called a 'filter substrate'. The filter part 102F has a plurality of (preferably parallel) apertures 104 to transmit the extreme ultraviolet radiation and to suppress transmission of the second type of radiation. As is mentioned above, for example, the EUV radiation can be transmitted by the spectral purity filter without changing the direction of the radiation. In an embodiment, each aperture 104 has been manufactured by an anisotropic etching process (as will be explained below).

Advantageously, EUV radiation directly transmitted through the apertures 104, desirably utilizing a relatively thin filter 100, in order to keep the aspect ratio of the apertures low enough to allow EUV transmission with a significant angular spread.

According to an embodiment, a thickness TH of the filter part 102F (i.e. the length of each of the apertures 104) is smaller than 20 µm, for example in the range of 2-10 µm, for example the range of 5-10 µm.

More particularly, a thickness TH of the filter 100 (i.e. a length of each aperture) can be smaller than about 10 microns, for example in the range of about 2-10 microns, for example the range of 5-10 microns. A further embodiment includes a filter thickness TH of 10 microns.

According to an embodiment, each of the apertures 104 may have a diameter in the range of 100 nm-10 µm. Desirably, the apertures 104 each have diameter in the range of about 3-6 µm, for example the range of 3-4 µm.

A thickness Q1 of the walls between the filter apertures 104 (indicated by double arrow Q1 in FIG. 4E) may be smaller than 1 µm, for example in the range of about 0.4-0.6 µm, particularly about 0.5 µm.

In an embodiment, the apertures may provide an open area of about 70-80% of a total filter front surface.

In an embodiment, the filter 100 may be configured to provide at most 5% infrared light (IR) transmission.

In an embodiment, the filter 100 may be configured to transmit at least 60% of incoming EUV radiation at a normal incidence. In an embodiment, the filter 100 may provide at least 40% of transmission of EUV radiation having an angle of incidence (with respect of a normal direction) of 10°.

For example, each aperture 104 may be defined by a substantially vertical and textured sidewall 106. It has been found that such a vertical and textured sidewall 106 may be obtained by utilizing a deep reactive ion etching (DRIE) process to manufacture the apertures 104.

More particularly, apertures 104 having hexagonal cross-sections can be etched in a substrate (particularly a semiconductor substrate) using the anisotropic etching process.

According to embodiments of the invention, the filter 100 may further comprise a metal layer M disposed on top of the filter part 102F (see FIG. 9). In an embodiment, the metal layer M comprises or consists of molybdenum. In an embodiment, the metal layer M may be disposed on at least part of the sidewalls 106 of the apertures 104 (see FIG. 10).

In an embodiment, the filter part 102F may be selected from one or more of: a semiconductor part, a crystalline semiconductor part, a doped semiconductor part, a coated semiconductor part, and a an at least partly modified semiconductor part.

In an embodiment, the filter part 102F may contain at least one semiconductor material selected from Silicon, such as (micro-)porous Silicon, Germanium, Diamond, Gallium Arsenide, Zinc Selenide, and Zinc Sulfide.

According to an embodiment, the apertures of the EUV transmissive filter 100 have a period Q2 (indicated in FIG. 4E) of in the range of about 3 to 6 µm, particularly 3 to 4 µm, for example 4 µm. The optionally metal layer M desirably has a thickness of at least 10 nm, for example at least 0.5 µm.

An embodiment of the invention includes the apertures 104 having a period of about 3 µm, and the metal layer M preferably having a thickness of about 0.6 µm.

For example, the filter 100 may include a freestanding thin film of Silicon (Si) 102F and an array of apertures 104 with substantially vertical (i.e. perpendicular to the film surface) sidewalls 106. The diameter of the apertures 104 is desirably larger than about 100 nm and more desirably larger than about 1 µm in order to allow EUV radiation to pass through the spectral purity filter 100 without substantial diffraction. Although the apertures 104 are shown as having a circular cross section (in FIG. 3), other shapes are also possible, and can be preferred. For example, hexagonal apertures (see FIGS. 4E, 6, and 8) may be advantageous from the point of view of mechanical stability.

For example, a wavelength to be suppressed by the filter 100 can be at least 10× the EUV wavelength to be transmitted. Particularly, the filter 100 is configured to suppress transmission of DUV radiation (having a wavelength in the range of about 100-400 nm), and/or infrared radiation having a wavelength larger than 1 µm (for example in the range of 1-11 microns).

An aspect of the invention provides a method for manufacturing the transmissive spectral purity filter 100. In an embodiment, the method comprises etching a plurality of apertures in a substrate 102 (for example a semiconductor substrate) using an anisotropic etching process. In an embodiment, the etching creates textured sidewalls that define the apertures. The method may also include depositing a metal layer on top of the substrate 102, for example a metal layer comprising molybdenum. The method may involve an etching process comprising alternately exposing the substrate 102 to an $SF_6$ plasma and a fluor carbon plasma.

As will be explained below (see FIGS. 4A-4E), in a further embodiment, the method can include providing a semiconductor substrate 102 having an etch stop layer 102S, and using the anisotropic etching process to etch through the semiconductor substrate so that the apertures reach the etch stop layer 102S.

Preferably, part of the substrate 102 can be removed by an etch that stops at a predefined etch stop layer 102S included in the starting substrate material. This allows very thin filter parts 102F to be lifted off a substrate (or remaining substrate part), for example without covering the aperture structure 104 with a protective layer, which would substantially reduce the EUV transmission. Moreover, in another preferred aspect, a back side of the substrate 102 can be patterned with a protective oxide/nitride coating, for example prior to a lift-off etch step, such that a filter holding frame 102C is left to support the thin filter.

Also, for example, the method can include removing the etch stop layer 102S at least from a back side of the filter part 102F, after having manufactured the apertures in the substrate. Also, the method can include providing the etch stop layer 102S within the semiconductor substrate, spaced-apart from two outer substrate surfaces (as in see FIG. 4A). For example, the etch stop layer 102S can extend in parallel with the external substrate surfaces.

According to a more particular embodiment of the invention, the spectral purity filter 100 may be manufactured by using a method that is based on the technique of deep reactive ion etching (DRIE), as illustrated in FIGS. 4A-4E. DRIE is an etching method with highly anisotropic etch rates, which enables the manufacturing of vertical etch profiles in Si using the so-called Bosch process. This is described for example in S. Tachi, K. Tsujimoto, S. Okudaira, *Low-temperature reactive ion etching and microwave plasma etching of silicon*, Appl. Phys. Lett. 52 (1988), 616. The Bosch process consists of alternatingly exposing the Si surface to an $SF_6$ plasma and a fluorocarbon (e.g. $C_4F_8$) plasma. In the first stage, silicon is etched in a more or less isotropic way, whereas in the second stage, the etched profile is covered by a passivation layer. In the next etch this passivation layer is opened preferentially at the bottom, mainly by ion bombardment, and etching starts again. By repetition of the etch/passivation cycle, the etch proceeds layer by layer downwards into the silicon surface.

An embodiment of the manufacturing method comprises (i) applying a hard mask of an aperture pattern on top of a freestanding thin Si film, and (ii) deep reactive ion etching the aperture pattern vertically through the entire Si film.

An embodiment of the manufacturing method comprises (i) applying a hard mask of an aperture pattern on a substrate with a Si surface, (ii) deep reactive ion etching the aperture pattern vertically into the Si surface and (iii) removing the part of the substrate below the etched apertures.

For example, the spectral purity filter illustrated in FIG. 3 may include a starting material 102 that is a SOI (silicon-on-insulator) wafer, for example a (crystalline) Si wafer with an oxide layer 102B buried at a specific depth, e.g. by oxygen ion implantation.

Figure 4A:
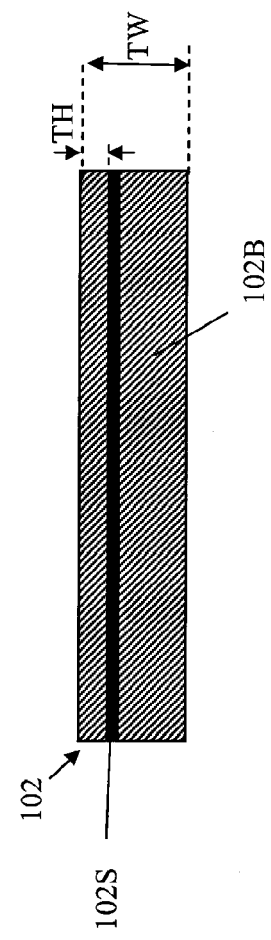
FIGS. 4A-4E depicts a schematic overview of an embodiment of a manufacturing process of a spectral purity filter.

The SOI wafer 102 thus consists of a top Si layer (film) 102F, a $SiO_2$ intermediate layer 102S, and a bottom Si layer 102B. An example of such a wafer 102 is shown in FIG. 4A. For example, a thickness TW of the wafer can be smaller than 1 mm, for example 670 micron.

Figure 4B:
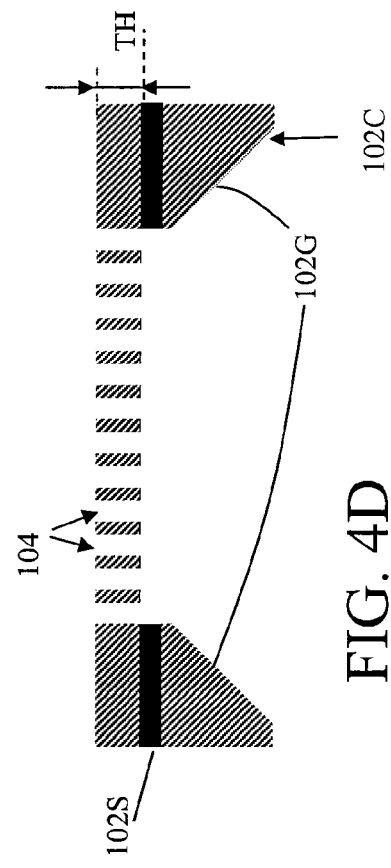

Using DRIE, the aperture pattern (of hexagonal apertures) may be etched in the top Si layer (from a front side) that will provide the filter part 102F; the result is schematically shown in FIG. 4B. The $SiO_2$ layer 102S acts as an etch stop.

Figure 4C:
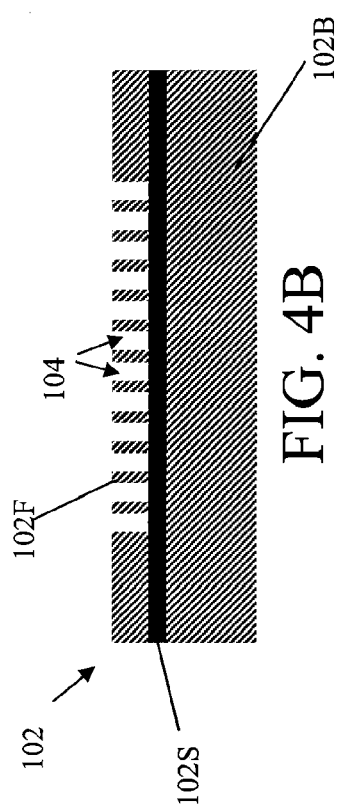

Subsequently, at least part of the bottom Si layer 102B extending under the aperture pattern 104 may be etched away using a KOH etch. Preferably, part of the bottom layer 102B is left standing to provide a respective (lower) section of a filter holder 102C. The result is shown in FIG. 4C. Again, the $SiO_2$ layer may act as an etch stop.

Figure 4D:
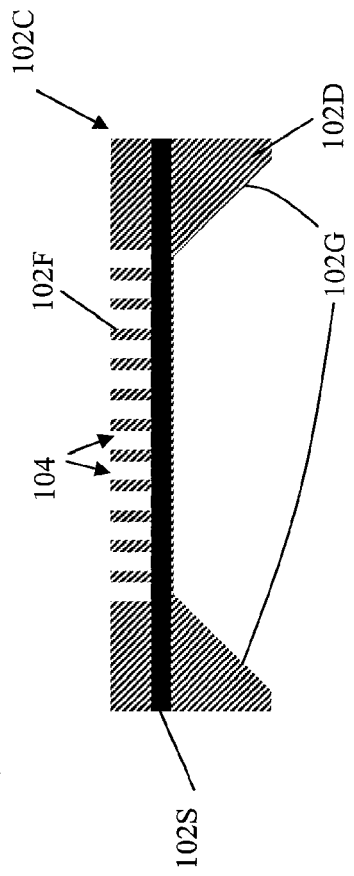

Finally, the $SiO_2$ may be removed using a buffered oxide etch, the result being depicted in FIG. 4D. Also in this case, preferably, only part of the etch stop layer 102S is removed, to open up the apertures 104, wherein a remaining part of the bottom layer 102S is left standing to provide a respective section of a filter holder 102C.

As follows from FIGS. 4C-4D, preferably, the filter 100 is provided with a filter holder 102C, external to the filter part 102F having the apertures 104. For example, the filter holder 102C can be configured to surround the filter part 102F. Preferably, the filter holder 102C is substantially thicker than the (in this embodiment central) filter part 102F. For example, a thickness of the holder 102C (measured in a direction parallel to the apertures 104) can be over 20 micron, for example at least 0.1 mm.

The present filter holder 102C is an integral part of the filter 100, substantially made of filter part (semiconductor) material. For example, the filter holder 102C can be a frame 102C surrounding the filter part 102F. In the present example, the filter holder 100C still contains part of the etch stop layer (being 'buried' in respective substrate material), and a support part 102D that is substantially thicker than the filter part 102F. In the present example, the filter part 102F and the support layer 102D are made from the same material.

In the example shown in FIGS. 4C-4D, the filter holder 102C may have been formed while etching away the part of the bottom Si layer 102B extending under the aperture pattern 104. When using (100) oriented Silicon substrate as a starting material, sloped walls 102G of the filter holder 102C may result from the etching process. If so, the sloped walls 102G are likely to coincide with a (111) plane of the Silicon crystal.

The desired filter part 102F may be so large that it may be preferable to provide support, not only at locations surrounding the filter part 102F, but also at locations directly below the filter part 102F. This may be achieved by splitting the filter part 102 into a plurality of areas that are to be etched separately. A simplified result (showing just the geometry in the Silicon) of such an etch is shown in FIGS. 4F-4G. FIG. 4F is a top view and FIG. 4G is a cross-section along the line AA' in FIG. 4F. The Figures show two areas 103 that are etched in a Silicon substrate. The support part 102D is also present between the areas, which would cause a portion 102D' of the support part 102D to be located directly located behind the filter part 102F. Again, the sloped walls 102G may coincide with a (111) plane of the Silicon crystal.

A way which is likely to avoid formation of sloped walls 102G are likely to be is to use a (110) oriented Silicon substrate instead of a (100) Silicon substrate. Because some of the (111) planes in a (110) oriented Silicon substrate are perpendicular to the substrate surface, walls coinciding with these (111) planes will be vertical instead of sloped.

Figure 4E:
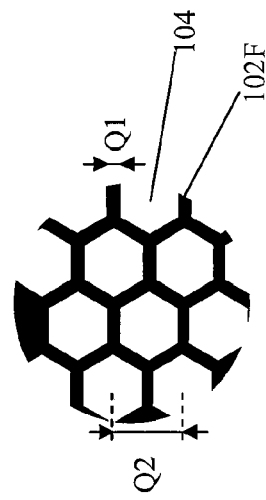
Figure 4F:
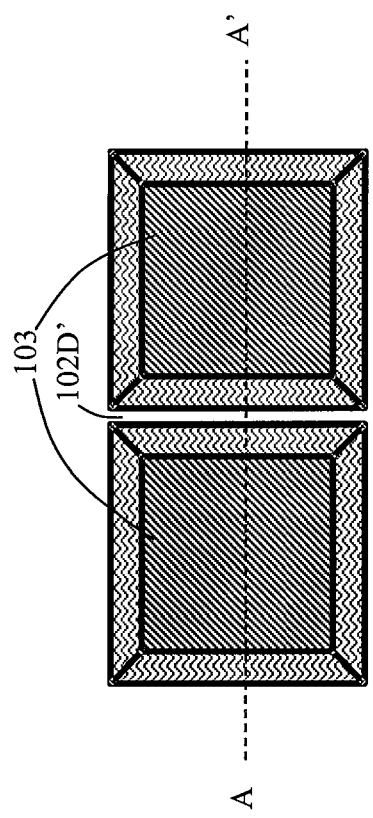
FIGS. 4F-4I schematically depict a portion of a support part of yet other embodiments of a process of a spectral purity filter.
Figure 4G:
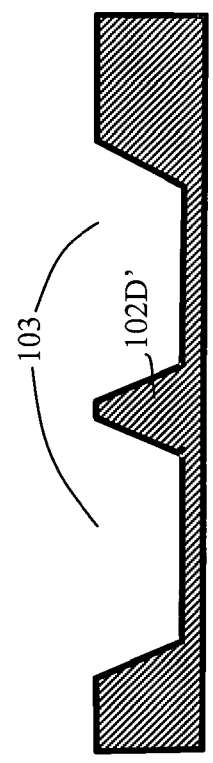
Figure 4I:
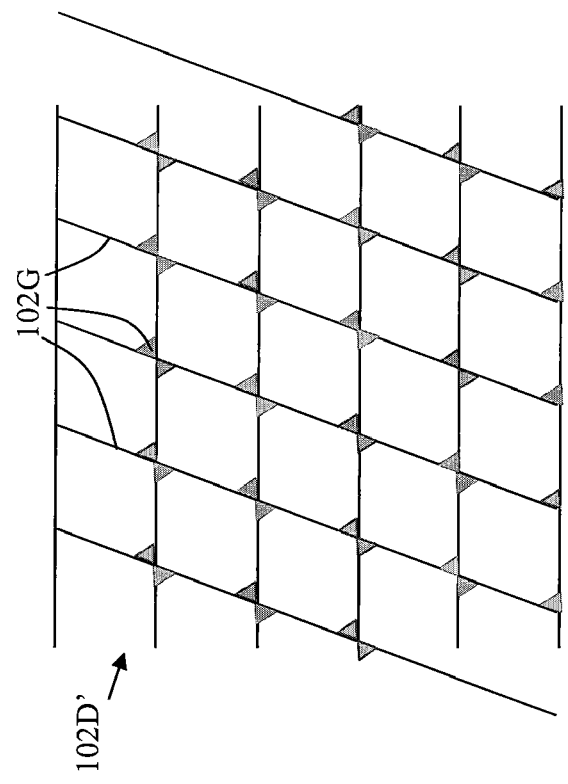
Figure 4H:
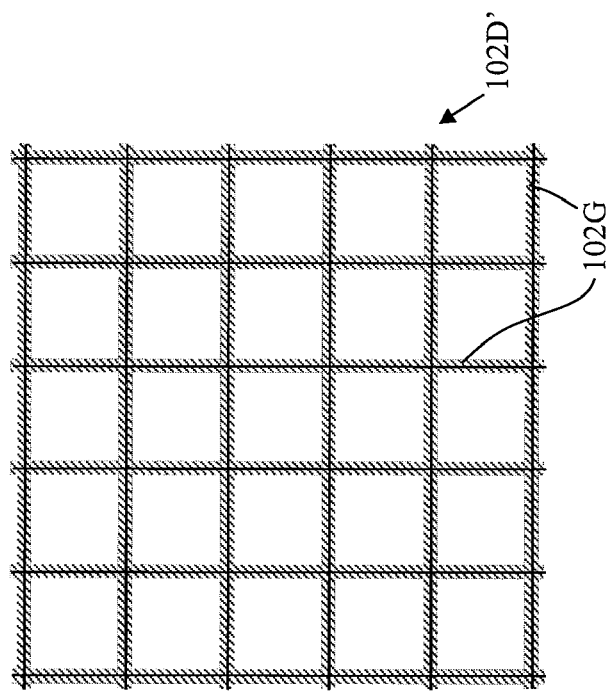

FIG. 4H and FIG. 4I depict a portion 102D' of the support part 102D in a (100) oriented Silicon substrate and in a (110) oriented Silicon substrate respectively. The hatched portions in FIG. 4H refer to sloped walls 102G of the portion 102D' of the support part 102D. In FIG. 4I, the walls are generally vertical instead of sloped because of the crystal orientation of the (111) planes with respect to the (110) planes. The (111) planes that are perpendicular to the (110) planes that form the substrate surface are oriented at an angle of 70.5°. However, the triangular portions in FIG. 4I denote portions of the walls 102G that are not perpendicular to with respect to the (110) planes that coincide with the substrate surface. The forming of these portions is caused by (111) planes that are at an angle of 35.3°.

If, in FIG. 4H, the etch would be 500 μm, the width would be 707 μm, because the angle between the (111) plane forming the sloped wall 102G and the (100) plane forming the substrate surface is are oriented with respect to each other at an angle of 54.7°. Owing to this width, the portion 102D' of the support part 102D of FIG. 4H blocks more radiation transmitted by the filter part 102F than the support part 102D of FIG. 1.

In an embodiment, the filter part 102F may comprise (micro-)porous Silicon. Silicon in this form has a lower density than crystalline Silicon. Also, (micro-)porous Silicon has a higher EUV transmission. Since usually, incoming EUV radiation is incident on the filter under an angle of between about −13° and about +13° with respect to the normal of a surface of the filter part 102F. A filter part 102F formed by such a material may be manufactured by way of anodization or etching.

FIG. 4E schematically shows part of the hexagonal apertures 104 in the substrate layer 102F. Arrow Q1 indicates a thickness Q1 of the walls between the filter apertures 104 Arrow Q2 indicates the period of the apertures. The thickness Q1 can be relatively small by application of the present manufacturing method. Also, the (close packed) hexagonal structure of the walls of the filter part 102F provides a very durable and open configuration.

An example of a process flow used for a non-limiting example of this manufacturing method is shown in Table 1:

TABLE 1

| Process flow used for creating Si-based grid SPFs | |
|---|---|
| Application oxide/nitride | Hard mask for the KOH etch. Oxides and nitrides are etched very slowly by KOH and are therefore suitable hard mask materials. The layer is formed by thermal oxidation or nitridation, respectively, and is therefore applied on both sides of the wafer. |
| Alignment markers | For aligning the structures on both sides of the wafer. |
| Litho back side | Patterning of windows on the back side by lithography. This is where the grid will be made freestanding. |
| RIE back side | Removal of oxide/nitride layer from windows in back side using reactive-ion etching. |
| RIE front side | Removal of oxide/nitride layer from front side using reactive-ion etching. |
| Litho front side | Patterning of grid structure on the front side of the wafer by lithography. |
| DRIE front side | Deep reactive-ion etching of grid structure in top Si layer using the Bosch process. |
| KOH etch back side | The KOH etch is a highly anisotropic Si etch that etches <100> crystallographic planes much faster than <111> planes. The etch is done in a heated KOH solution. Si is etched away in the windows from the back side; $SiO_2$ acts as etch stop. The front side of the wafer is protected using a vacuum seal. |
| BOE back side | The remaining $SiO_2$ is removed using a buffered oxide etch, comprising HF and a buffer agent, commonly $NH_4F$. |

In an embodiment, another layer may act as an etch stop.

In an embodiment, no dedicated etch stop layer is used, and the etch depth may be controlled otherwise, for example by timing.

In an embodiment, etching methods other than a KOH etch may be used to remove (part of) the substrate, for example, a DRIE etch.

The Si grid 102F may also be released from the substrate by other methods, for example, by removing or dissolving a temporary bond (e.g. a glue or adhesion layer) between the grid layer and the substrate material.

Figure 5:
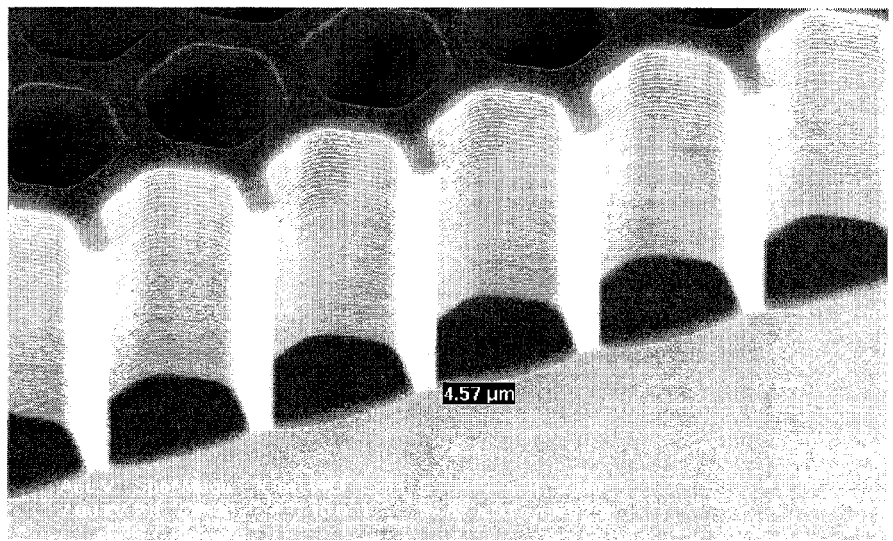
FIG. 5 is an image of a tilted cross-section of a spectral purity filter in accordance with an embodiment of the present invention.
Figure 6:
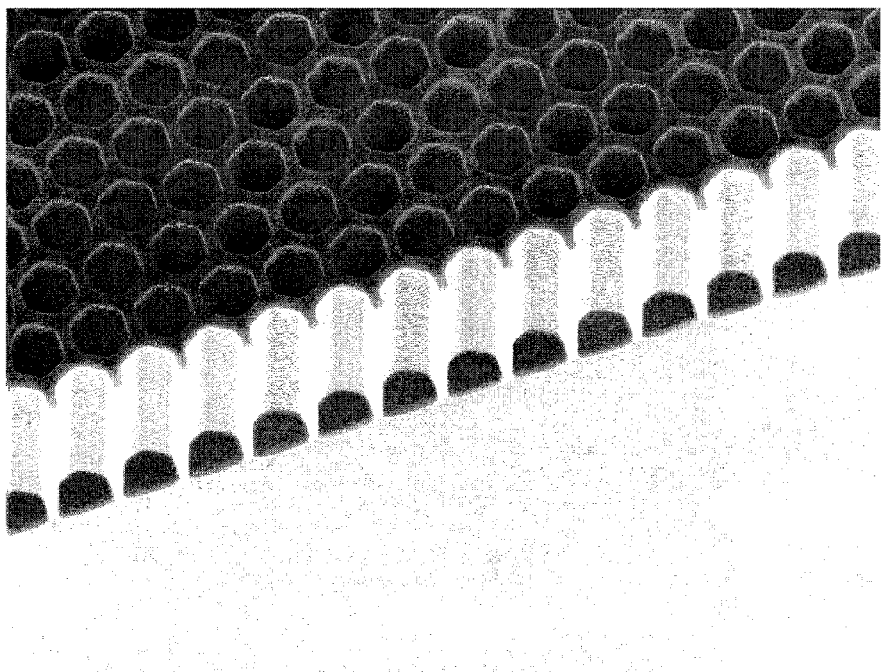
FIG. 6 is a more detailed image of the spectral purity filter of FIG. 5.
Figure 7:
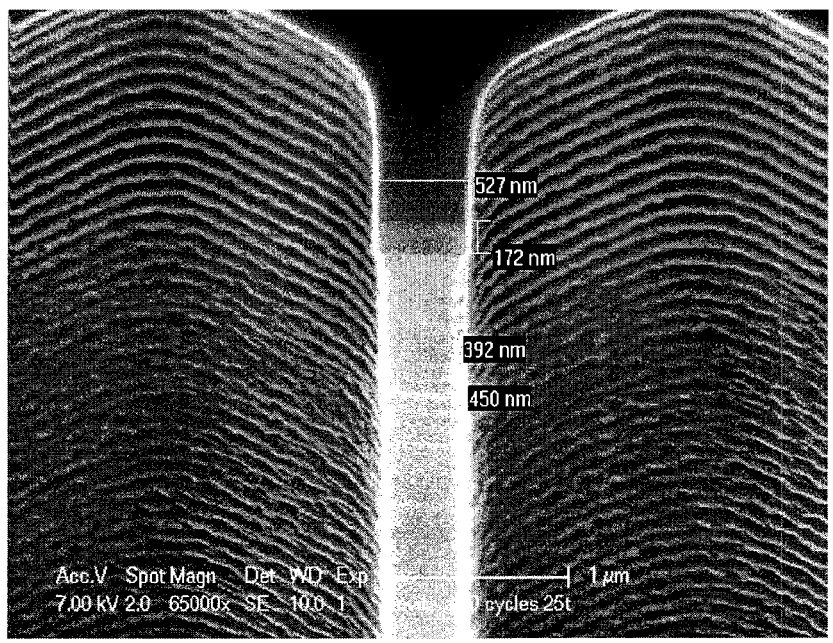
FIG. 7 is an image of a tilted cross section of a portion of a spectral purity filter in accordance with an embodiment of the present invention.
Figure 8:
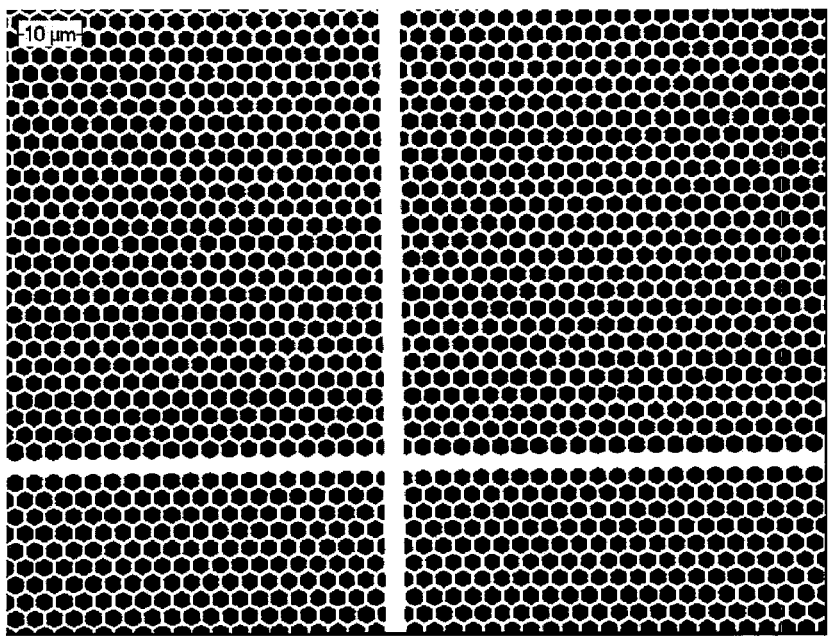
FIG. 8 is a top view of a spectral purity filter in accordance with an embodiment of the present invention.

FIGS. 5-8 illustrate example of spectral purity filters that have been manufacturing in accordance with embodiments of the present invention. FIGS. 5 and 6 are images of tilted cross sectional view of a spectral purity filter having apertures with a period of about 3 μm. The depth of the apertures (corrected for the viewing angle) is about 10.8 μm. FIG. 7 is an image of a tilted cross section of a wall between two apertures. As show in FIG. 7, the walls are textured, particularly scalloped, and have a thickness variation along the surface of the wall, which is indicated of the DRIE process. The top layer in FIG. 7 is an $SiO_2$ hard mask used for the Bosch process and has a thickness of about 400 nm when corrected for the viewing angle. FIG. 8 is a top view of a freestanding spectral purity filter 100 in accordance with an embodiment of the present invention.

Several grid SPF types can be distinguished based on different mechanisms for suppression of unwanted 10.6 μm radiation. The Si grid in accordance with embodiment of this invention may be modified according to the specifications of these grid types.

For example, for a sub-wavelength reflective grid SPF, as described in United States patent application publication no. 2006/0146413, a pure Si grid may not be sufficient, since Si is transparent at 10.6 μm. As is mentioned above, in an embodiment, the Si grid may be coated with a thin reflective layer, preferably a metal, for example molybdenum. Depending on the deposition method and conditions, two types of deposition geometries can occur. These are shown schematically in FIGS. 9A and 9B. FIG. 9A shows a cross section where metal covers only the top part of the silicon grid, while FIG. 9B shows a cross section where the metal covers the sides of the silicon walls as well. As will be shown below, this makes a large difference optically. FIG. 10 shows an alternative embodiment, wherein a reflective layer covers all sides of the filter grid.

Figure 11:
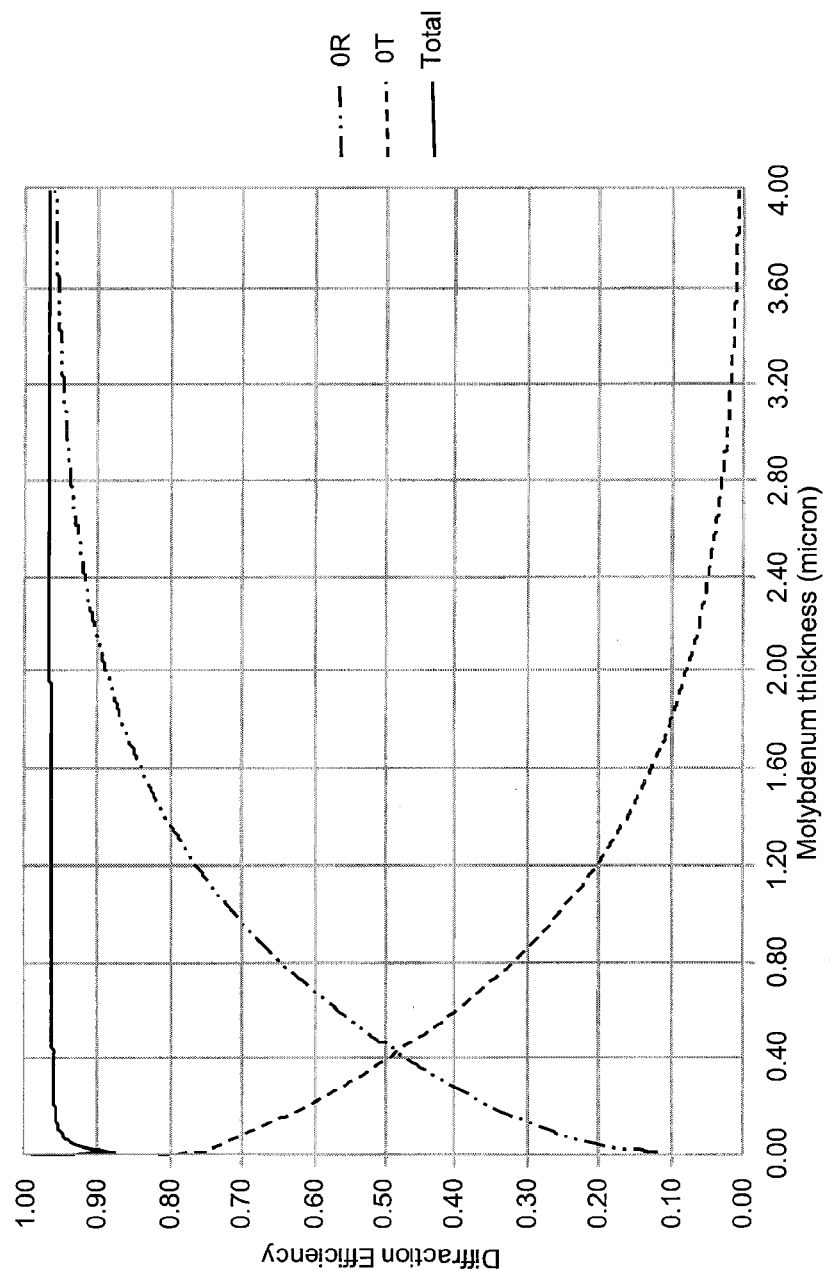
FIG. 11 is a graphical representation of a simulation result of reflection and transmission of the spectral purity filter of FIG. 9A as a function the thickness of a top layer.

FIG. 11 shows the simulation results obtained using the GSolver simulation package for a one-dimensional geometry like the one shown in FIG. 9A. Molybdenum is deposited only on the top surface of a 10 μm thick silicon grid. The grid has a period of 4 μm and a duty cycle of 10%. It can be seen that in order to reach a target of 5% IR transmission, a thick metal coating of at least 2 μm is desired. The desired thickness can be reduced by using a smaller period of the grid. For example, when the period is 3 μm, a metal coating of 0.6 μm should be used to reach 5% IR transmission.

Figure 12:
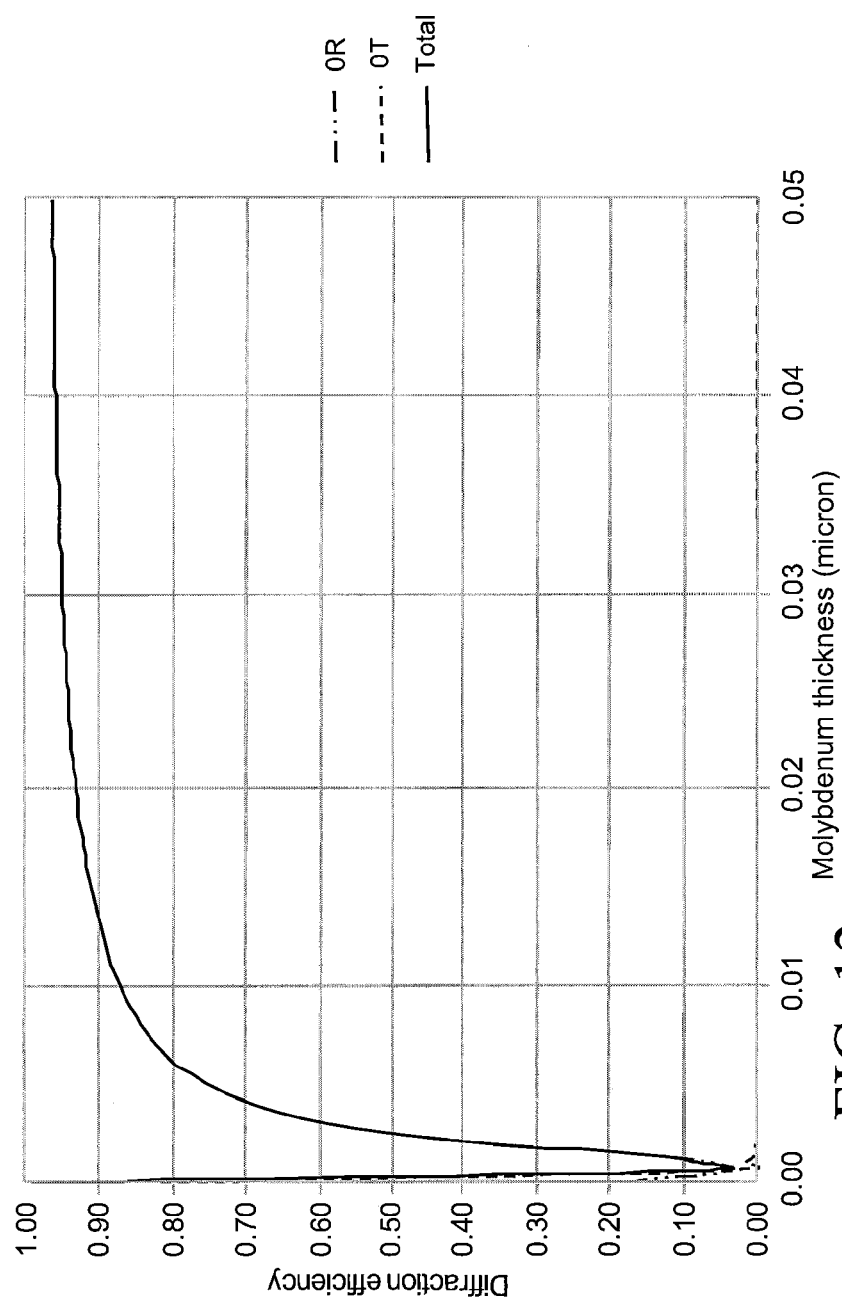
FIG. 12 is a graphical representation of a simulation result of reflection and transmission of the spectral purity filter of FIG. 9B as a function of thickness of a top layer.

When the metal coating covers both the top surface and the sidewalls of the silicon grid, the situation changes dramatically. FIG. 12 shows the simulation results for again a 10 μm thick grid with a 4 μm period and a 10% duty cycle. However, molybdenum now covers the side walls as well, and as a consequence the IR transmission drops to nearly zero already for a coating of only a few nanometers thickness. At such a small thickness, most power is absorbed in the grid. In order to make the grid substantially reflective, e.g. with 95% reflectivity, a coating of ~30 nm is desired.

An aspect of the invention provides a method to apply a reflective coating 102R on the filter (for example Silicon) grid 101F with a minimal loss of EUV transmittance. According to this aspect, a reflective layer 102R is formed by atomic layer deposition (ALD). In this way, a uniform coating thickness of a three-dimensional coating structure 102R can be achieved. Since the thickness of the coating 102R is uniform, a desired infrared reflectivity can be achieved with a minimal loss of EUV transmittance due to excess coating thickness.

Particularly, by application of ALD, excess coating thicknesses at the top of the grid can be avoided, whilst retaining sufficient coating thickness down the sidewalls 106 of the grid 102F.

FIG. 10A depicts a basic embodiment of a filter part (grid) 102F and a reflective coating 102R (i.e. reflective for unwanted radiation) that fully encloses the grid 102F and has a uniform thickness. As follows from the above, a preferred manufacturing method for deposition of the reflective coating 102R is atomic layer deposition (ALD). ALD uses alternating steps of a self-limiting surface reaction to deposit atomic layers one by one. The material to be deposited is provided through a precursor. ALD methods are known for several metals, for example, Ti, Ru, Pd, Ir, Pt, Rh, Co, Cu, Fe and Ni. An embodiment may use a reflective coating 102F consisting of Ruthenium (Ru), particularly in case Ru is already present in a system that is to utilize the filter (for example a lithographic apparatus having an EUV source-collector module that comprises Ru). In an embodiment, the reflective coating 102R may not a metal but another material that is reflective for the unwanted radiation, for example TiN or RuOx, or a conductor material.

In an embodiment, the coating 102R does not fully, but instead partially enclose the grid. For example, it may be advantageous to leave the back side of the grid 102F uncoated to increase the emissivity and thus enhance radiative cooling of the grid.

Instead of ALD, galvanic growth (electrodeposition) may be used to deposit the reflective coating 102R.

It may not be practical to apply a coating that fully covers the sidewalls of a 10 μm thick grid. Therefore, in an embodiment, the coating is applied only partly down the sidewalls. For example, when the coating of the last-mentioned embodiment is applied on top of the grid and down the first 2 μm along the sidewalls of the grid, the optical behaviour is essentially the same as in FIG. 12 as shown by simulations.

In another embodiment, the filter may be provided with a reflective coating 102R configured to reduce absorption of short wavelength radiation. For example, a broadband DUV reflector may be provided, for instance, forming the coating 102R by an Aluminium layer. Alternatively, DUV reflective coatings may be configured for specific wavelength bands. Method to achieve this are, for example, described in Proc. SPIE 5721 (2005), p. 72-80, 'Highly reflective coatings for micromechanical mirror arrays operating in the DUV and VUV spectral range' by T. Sandner et al.

Figure 10B:
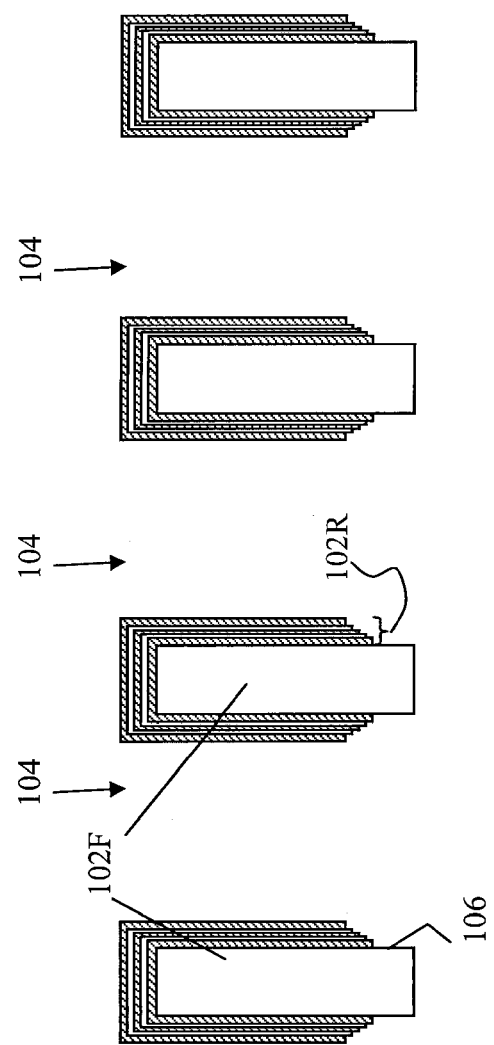
FIG. 10B depicts a schematic view of a cross section of a spectral purity filter in accordance with an embodiment of the present invention.
Figure 10C:
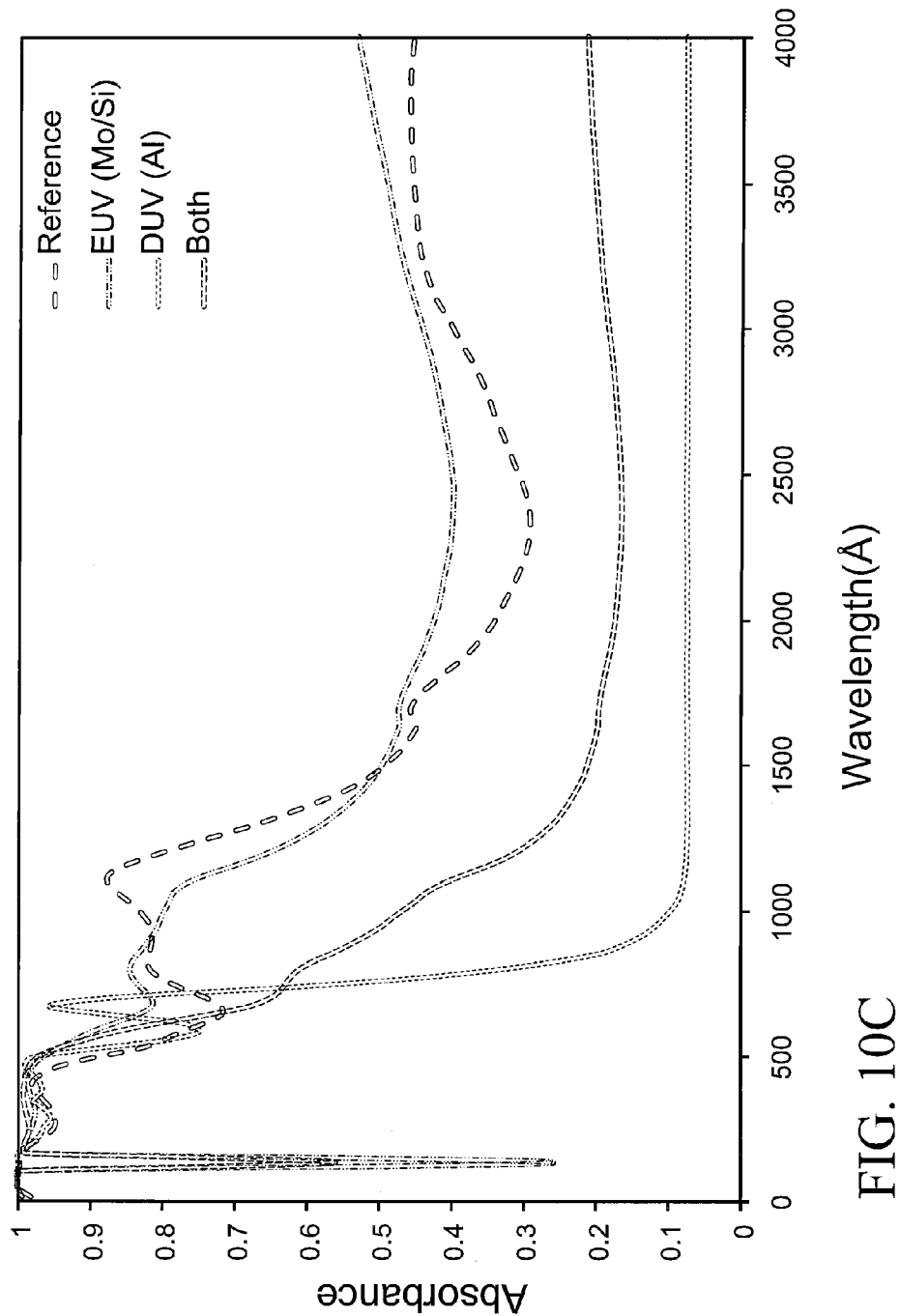
FIG. 10C depicts absorbance as a function of wavelength for different reflective coatings on a sprectral purity filter in accordance with an embodiment of the present invention.

Another embodiment of a filter provided with a reflective coating configured to reduce absorption of short wavelength radiation is depicted in FIG. 10B. The filter part 102F is provided with reflective coating 102R configured to reduce absorption of short wavelength radiation. A suitable coating 102R may be formed by a multilayer coating comprising alternating Molybdenum and Silicon layers. Theoretical reflectance for extreme ultraviolet radiation is between about 60% and about 70% depending on its angle of incidence. In order to avoid diffusion between the Molybdenum layers and the Silicon layers, diffusion barriers may be provided. These barriers may be located at interfaces between the Molybdenum and Silicon layers. The barriers may be $B_4C$ or $B_9C$ layers.

Yet another embodiment of a filter provided with a reflective coating configured to reduce absorption of short wavelength radiation may be provided with both the multilayer mirror comprising the alternating layers and the Aluminium layer. The Aluminium layer may be provided on top of the multilayer mirror.

Figure 13:
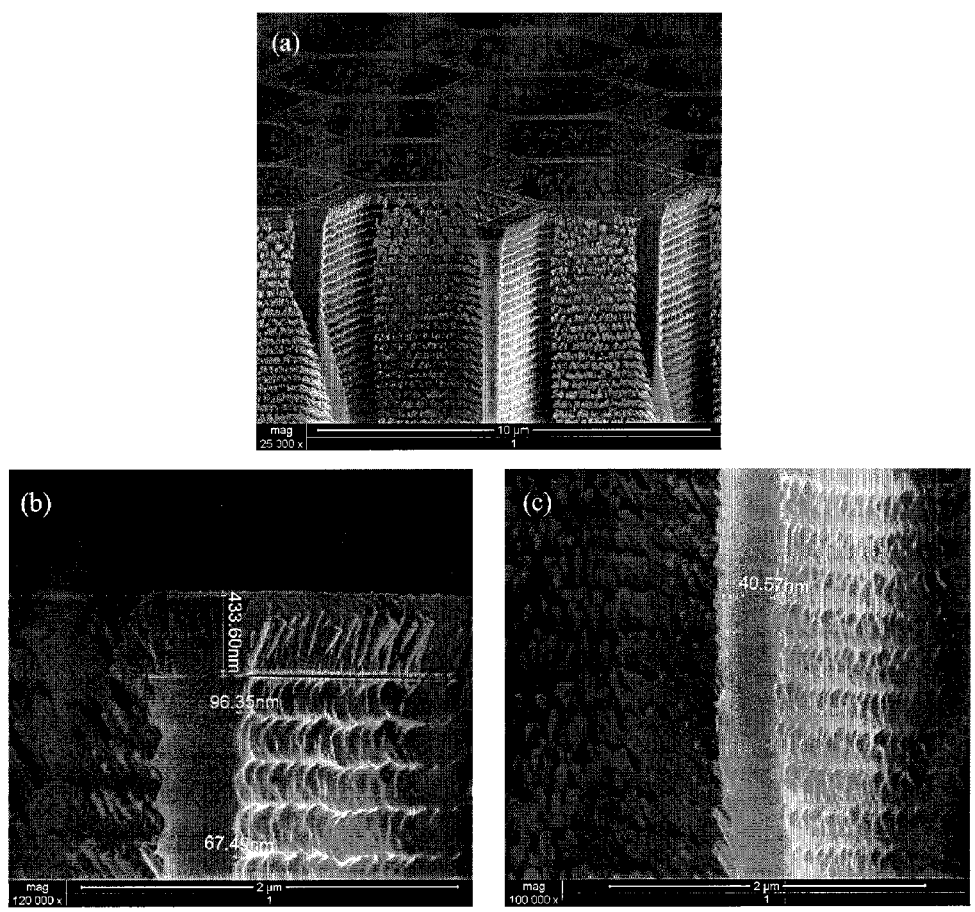
FIGS. 13a-13c are various images of a spectral purity filter in accordance with an embodiment of the present invention.

As can be seen in FIG. 10B, the multilayer mirror coating may be provided on the sidewalls Metals can be deposited on a Si grid, for example by evaporation (see FIG. 13) or sputter deposition. According to another aspect, the metal is deposited utilizing Atomic Layer Deposition FIG. 13 illustrates an embodiment where an evaporated layer of Mo with a nominal thickness of about 350 nm is used. FIG. 13a shows an overview of the top and cross section of the coated grid, FIG. 13b shows a wall cross section at the top of the grid, and FIG. 13c shows the wall cross section at a 5 μm depth.

Figure 14:
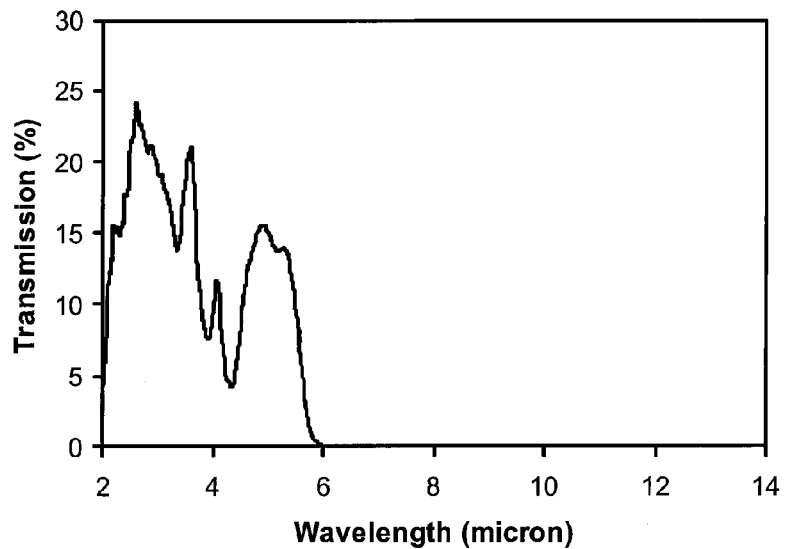
FIG. 14 is a graphical representation of measured infrared (IR) transmission of a spectral purity filter in accordance with an embodiment of the present invention.

FIG. 14 shows a measured infrared transmission spectrum of a freestanding Si grid with a period of 4 μm, coated with a thin Mo layer. This demonstrates that 10.6 μm radiation is suppressed by at least two orders of magnitude, which is sufficient for practical spectral purity requirements.

In some SPFs, the 10.6 μm radiation may be absorbed in the grid material. Such a grid can be realized with embodiment of the present invention by using doped Si. A typical embodiment according to this aspect of the invention comprises a Si grid with a doping concentration in excess of $10^{18}$ atoms/cm$^3$.

M. Auslender, S. Hava, *Doped n-Type Silicon*, in: E. D. Palik, Handbook of optical constants of solids III (Academic Press, London, 1998), 155 reports that the refractive index of Si can be substantially changed by doping it with n-type impurities such as P or As. For example, at a high concentration of $10^{20}$ atoms/cm$^3$, the refractive index at 10.6 μm is about n=1.6, k=4, compared to n=3.74, k=0.001 for pure Si.

At such high values of the extinction coefficient, the material is substantially absorbing rather than transparent.

Figure 15:
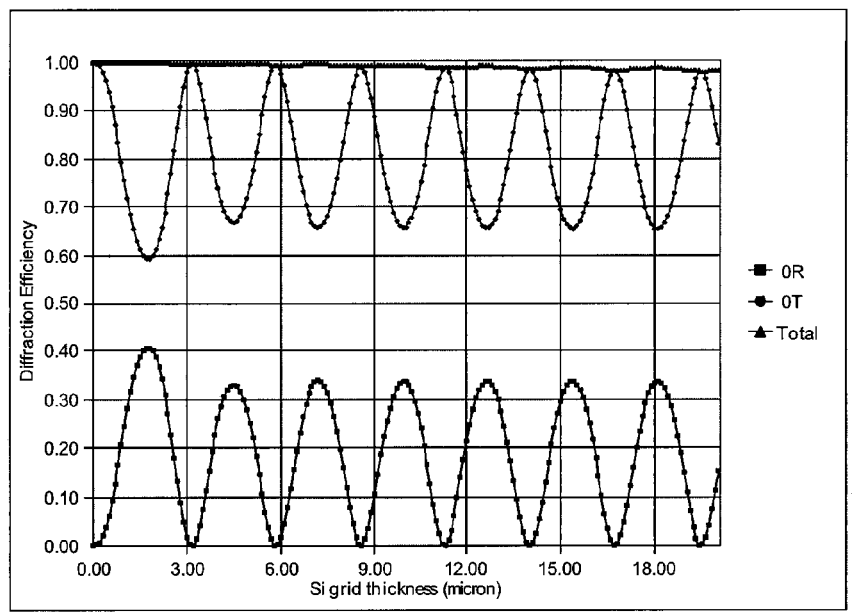
FIG. 15 is a graphical representation of reflection and transmission of a spectral purity filter in accordance with an embodiment of the present invention.
Figure 16:
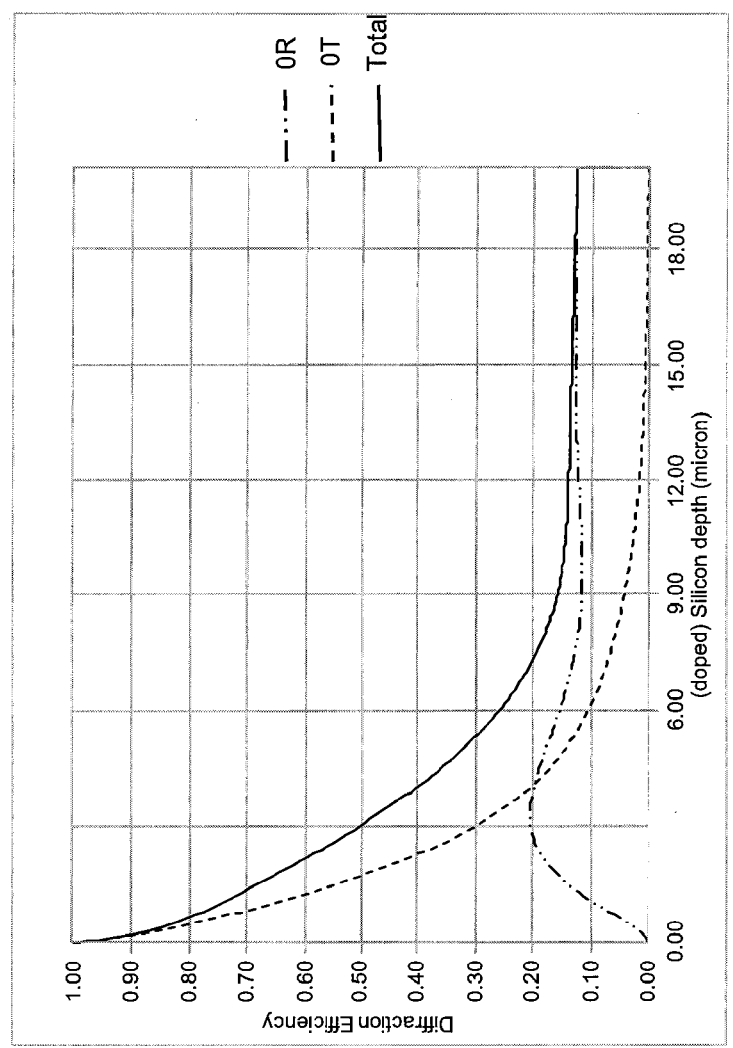
FIG. 16 is a graphical representation of reflection and transmission of a spectral purity filter in accordance with an embodiment of the present invention.

As shown in FIG. 15, a grid made of pure silicon shows oscillations in the transmission as a function of its thickness, due to interference in the layer. However, overall the transmission remains high. FIG. 16 shows the optical behavior of a grid with the same dimensions as in FIG. 15, made of n-type doped Si. The doped grid shows a continuous decrease of IR transmission as a function of the grid thickness. For example, at a grid thickness (depth) of 9 µm, about 4% of the incident infrared radiation is transmitted, about 12% is reflected, and the remainder (about 84%) is absorbed. Thus, the grid is substantially absorptive. Similar behavior is expected for p-type doped Si.

A manufacturing method for a doped Si grid may be the same as for a pure Si grid as described earlier, with the starting material comprising doped Si rather than pure Si. It is not expected that the doping will affect the DRIE process significantly.

In embodiments of the manufacturing methods, the doping may be introduced after manufacturing of the grid, for example by ion implantation or thermal diffusion.

In certain embodiments, it may be advantageous to convert at least a part of the Si grid into a silicide, for example $MoSi_2$, $TiSi_2$ or $ZrSi_2$. Depending on the optical properties of the silicide, the grid may remain substantially transparent (e.g. a phase grating), or become absorbing (e.g. sub-wavelength absorbing grid) or reflective (e.g. sub-wavelength reflective grid) for unwanted radiation.

Silicidation may be accomplished by applying a metal coating on the manufactured Si grid and heating it to the silicidation temperature in a protective atmosphere.

In order to create a microlens array SPF, the thickness TH of the Si grid 102F may be varied laterally. This may be done before or after manufacturing of the Si grid, e.g. by micromachining or lithography. Alternatively, one of the etch processes in the manufacturing of the grid may be modified such that the desired variation in thickness is obtained during etching.

An embodiment can include creating a microlens array (for example as part of the filter). For example, microlens array SPF may be created by laterally varying the doping concentration in the Si grid. This produces so-called graded index (GRIN) lenses due to the dependence of the refractive index on doping concentration as described above. The desired variation in doping concentration may be accomplished for example by using a focused ion beam, or by using uniform ion implantation in combination with a suitable mask.

According to another embodiment of a transmissive spectral purity filter, the spectral purity filter 200 comprises a filter part 202F comprising polyimide, the filter part 202F having a plurality of (preferably parallel) apertures 204 to transmit the extreme ultraviolet radiation and to suppress transmission of the second type of radiation.

For example, FIG. 17 illustrates a spectral purity filter 200 in accordance with an embodiment of the present invention. The spectral purity filter 200 comprises a freestanding thin film of vacuum-compatible polyimide 202F (such as Kapton®) comprising an array of apertures 204 with substantially vertical (i.e. perpendicular to the film surface) sidewalls 206. The polyimide grid is at least partially coated with a metal layer 208.

Kapton® is the trade name of a polyimide film. It is stable in vacuum at temperatures up to 200° C. At temperatures in excess of 200° C., outgassing becomes appreciable and at temperatures higher than 400° C., Kapton® starts disintegrating. Kapton® is an electrical insulator and a Kapton® grid is therefore preferably coated with another material so that it may become reflective for infrared radiation.

In an embodiment, a metal layer M, for example molybdenum, may be applied on top of the grid and at least partially down the sidewalls of the grid. For example, for a grid of 10 µm thickness, with apertures at a pitch of 4 µm and a wall thickness of 400 nm, a layer of about 30 nm Mo covering the top and the sidewalls of the grid 202F makes the grid substantially reflective (~95% reflectivity). This is demonstrated by one-dimensional GSolver simulations as shown in FIG. 12. Although the simulations were carried out with Si rather than Kapton® as a base material (because infrared optical constants for Kapton® are not readily available), the result is expected to be similar.

It may not be practical to apply a coating M that fully covers the sidewalls of a 10 µm thick grid. Therefore, the coating M may be applied only partly down the sidewalls (as shown in FIG. 17b). For example, when the coating is applied on top of the grid and down the first 2 µm along the sidewalls of the grid, our calculations indicate that the optical behavior is essentially the same as in FIG. 12.

Metals can be easily deposited on a grid, for example by evaporation or sputter deposition. A preferred method to deposit the metal is ALD, described above.

Under specific conditions, the heat load on the grid may be such that is desirable to seal off the Kapton® from the vacuum environment. This allows the Kapton® to be heated to higher temperature and possibly even disintegrate without detrimental effect on the vacuum conditions. Therefore, in a further embodiment, the Kapton® grid is completely coated with a metal layer.

In another embodiment, the Kapton® in a coated grid is deliberately disintegrated, for example by carbonization, prior to use in the lithography tool. The metal coating and the residue from carbonization may be strong enough to provide mechanical stability for the grid. This embodiment has the advantage that the grid can be heated to much higher temperature in the lithography tool without adverse effect on the vacuum conditions.

To create the spectral purity filter, Kapton® can be micromachined with very high precision using a pulsed KrF excimer laser, which emits at a wavelength of 248 nm. This short wavelength may offer an advantage of drilling smaller holes than that can be achieved by longer wavelength sources. The high energy ultraviolet photons directly break the molecular bonds holding the polymer together in a process called photoablation (cold ablation), which results in sharply defined, clean features with virtually no heat affected zone (HAZ). As Kapton® has quite good absorption in the ultraviolet region, the penetration depth of the short pulsed (30 ns) laser light will be very small. Since each pulse removes only a very thin layer of material, the drilling depth can be precisely determined by controlling the number of pulses.

Figure 18:
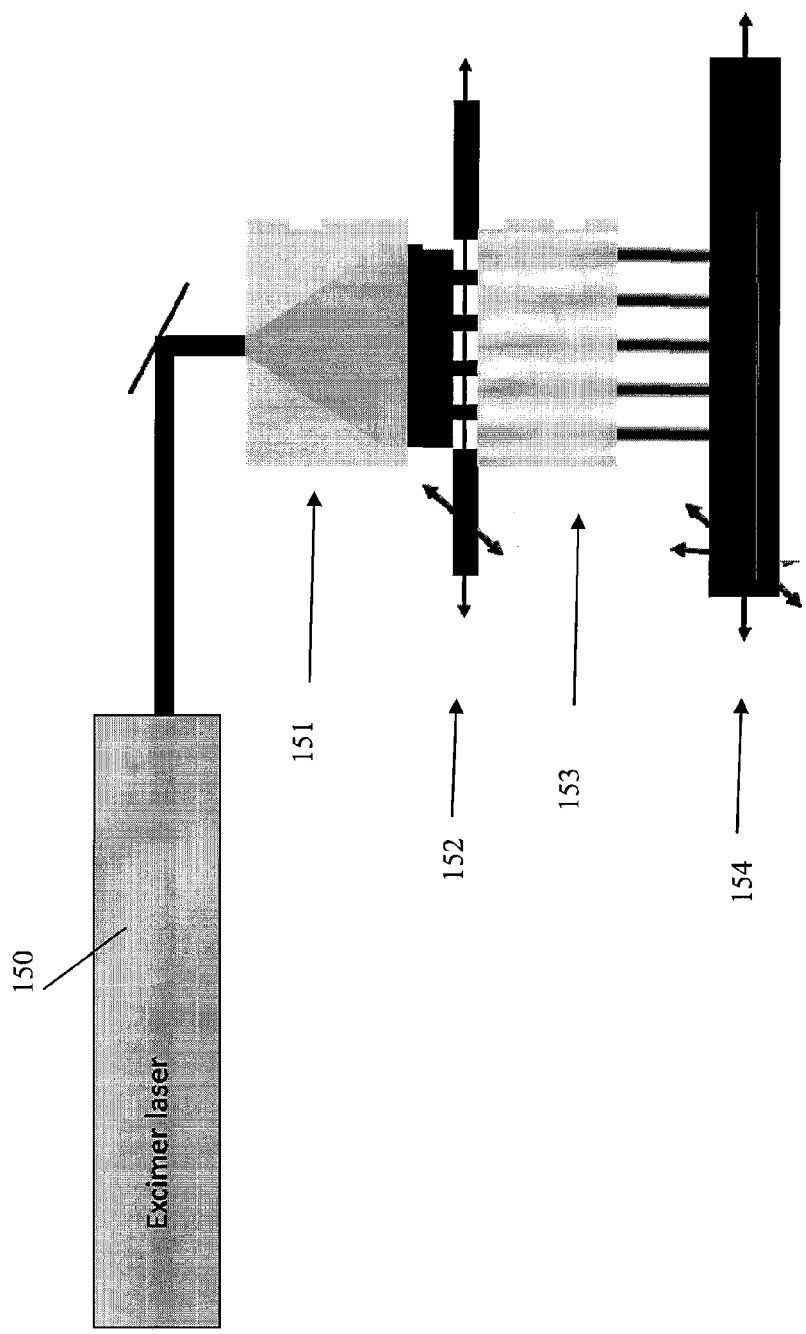
FIG. 18 depicts a schematic view of a manufacturing apparatus for manufacturing a spectral purity filter in accordance with an embodiment of the present invention.
Figure 19:
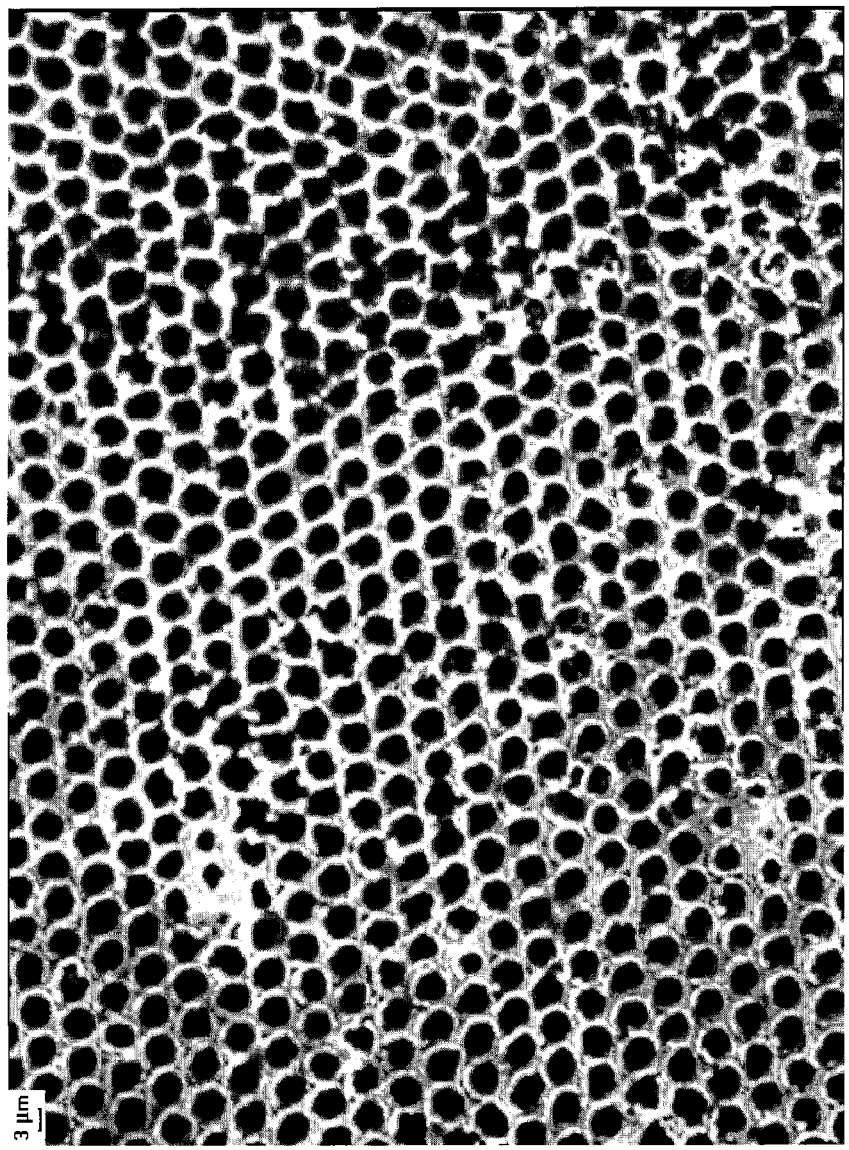
FIG. 19 is an image of a spectral purity filter in accordance with an embodiment of the present invention.

For drilling 4 µm holes in Kapton®, a photo masking technology where the laser beam illuminates a mask containing the pattern to be machined may be used. The experimental set-up is schematically shown in FIG. 18. The set-up includes an excimer laser 150, optics with homogenizers 151, a mask 152, imaging optics 153 and a translator stage 154 (configured to hold the Kapton®). The laser beam is homogenized with a pair of homogenizers 151 and directed towards the projection mask 152. Optionally, the homogenized beam is about 20×20 mm², and optionally the mask size used is only 10×10 mm². Thus, only the central part of the homogenized beam is used for projection and a homogenous illumination of the mask is guaranteed. The mask consists of 20 µm diameter holes at a pitch of 25 µm (wall thickness 5 µm). This pattern is imaged onto Kapton® with a projection lens 153 with demagnification by a factor of 5, resulting in an array of holes of 4 μm diameter with a wall thickness of 1 μm as shown in FIG. 19. In the present set-up, an area of 2×2 mm² can be processed in about 5 seconds. This is very fast compared to other proposed grid manufacturing methods, such as lithography-based methods or patterned crystal growth. A large area can be machined by stitching 2×2 mm² areas by moving the X-Y translating stage. When the thickness of Kapton® is equal to or less than 10 μm, the taper of the holes is negligible.

Processing of Kapton® at 248 nm produces debris, which may close the holes that have been drilled earlier partially or completely. Therefore, the debris should be removed by a cleaning step after laser processing. The hole array shown in FIG. 19 was made in a 30 μm Kapton® foil. For practical purposes it may be desirable to use thinner foil, for example 10 μm, which is commercially available. This may result in less debris, less tapering and a better geometrical transmittance of the hole array.

Another aspect of the invention relates to a lithographic apparatus. This aspect can be combined with the above-described embodiments, however, the present aspect can also be independent thereof.

As is mentioned above, radiation emitted by Laser Produced Plasma (LPP) EUV sources contains, besides EUV, a significant amount of scattered light from the infrared laser in this source. A non limiting example of the LPP source is shown in FIG. 2B. It has been proposed to apply spectral purity filters to limit the propagation through the system.

For example, when using LPP EUV sources, 13.5 nm EUV is not the only wavelength produced. Typically a $CO_2$ laser with a wavelength of 10.6 microns is used to produce the EUV emitting plasma in these LPP sources. Due to scattering and reflections part of this laser light is collected and transmitted by the optics of the EUV lithography system. This is undesirable for several reasons. Firstly, resist is sensitive to out-of-band wavelengths, and thus the image quality may be deteriorated. Secondly, unwanted radiation, especially the 10.6 μm radiation in LPP sources, leads to unwanted heating of the mask, wafer and optics. In order to bring unwanted radiation within specified limits, spectral purity filters (SPFs) are being developed.

Most commonly transmissive filters are used, i.e. the EUV light is transmitted, and the undesired wavelength (10.6 micron) is reflected or absorbed. A known approach is to use a structured metal film, with small holes (see United States patent application publication no. 2006/0146413). The light transmission will be small if the holes are significantly smaller than the wavelength of light. If they are much larger than the wavelength then the transmission will be proportional to the open area. Holes of for example 1 to 5 microns are small enough to block 10.6 microns radiation, while being large enough to transmit EUV. Instead of a 2D structure with holes, also a 1D wire-grid may be used. Such a grid reflects only one of the polarizations, but by using two of them in sequence in a crossed configuration both polarizations can be rejected.

However, in order to have sufficient EUV transmission the structure is preferably very open, and the walls between the holes (or the wires of the wire-grid) are preferably very narrow. When the metal parts are too narrow, the infrared radiation will not be effectively suppressed anymore, and the structure will be very fragile.

An aspect of the invention aims to improve IR suppression.

According to an embodiment, a lithographic apparatus comprises: a radiation source comprising a beam generator configured to generate a polarized radiation beam, the polarized beam being used to produce an extreme ultraviolet radiation output of the radiation source, wherein the extreme ultraviolet radiation output contains a part of the polarized beam; and at least one reflector to reflect the extreme ultraviolet radiation, wherein the configuration is such that the reflector at least receives a p-type polarized part of the polarized radiation part, in a respective plane of incidence.

In an embodiment, an angle of incidence of the radiation incident on the reflector is smaller than 20 degrees and larger than 1 degree, for example in the range of 0.5 to 10 degrees. For example, reflection of the EUV radiation by the mirror can be under or near grazing incidence conditions.

Desirably, the apparatus includes a plurality of mirrors in the path of the extreme ultraviolet radiation (the path particularly extending between the source SO and a substrate stage WT). In that case, advantageously, at least several of these mirrors are arranged to receive p-type polarized parts (if any) of infrared light that may be transmitted along with the EUV radiation beam (projection beam).

In an embodiment, the reflector can be part of an illumination system configured to condition the radiation into a beam of radiation.

In an embodiment, the reflector can be part of a projection system configured to project a patterned beam of radiation onto a target material.

In an embodiment, the beam generator is a laser, for example configured to generate infrared radiation (for example having a wavelength above 1 micron, or example about 10 microns). As an example, the laser is a $CO_2$ laser, The laser itself can be configured to generate a polarized beam. Alternatively, a polarizer can be applied to polarize laser light. In a preferred embodiment, the polarized beam (provided by the beam generator) is mainly of the p-type polarization. In a preferred embodiment, the polarized beam consists of p-type polarized (infrared) radiation.

For example, the radiation may be produced in the radiation source using plasma. The plasma may be created by directing a polarized laser beam at a plasma fuel, the fuel for example including or consisting of particles of a suitable material (e.g. tin), or by directing a the polarized laser beam at a stream of a suitable gas or vapor (acting as a plasma fuel), for example Xe gas or Li vapor. The resulting plasma emits radiation, for example EUV radiation may be collected using a collector, which receives the radiation and may focus the radiation into a beam.

An embodiment utilizes the state of polarization of infrared light (emanating from the source SO), to suppress transmission of that infrared radiation through the lithographic system. In that case, desirably, the polarization state of the laser in the source is selected such that the transmission of laser light through the system is minimized, particularly via application of the at least one reflector to reflect respective extreme ultraviolet radiation (whilst suppressing reflection of the polarized infrared radiation due to its polarity).

For example, a $CO_2$ laser to create the discharge in an LPP source is nearly always polarized. It is expected that to a large extent this polarization is maintained after scattering/reflection (for example of Sn droplets in the source and subsequent reflections on collector and other mirrors in the lithographic apparatus).

A schematic representation of an apparatus according to the present aspect is shown in FIGS. 2A, 2B. As is mentioned above, in the present embodiment, the radiation source SO may comprise a laser 130 configured to generate a polarized radiation beam, for example polarized infrared radiation. The polarized beam 130 is used to produce the extreme ultraviolet radiation output 132a of source SO. The extreme ultraviolet radiation output contains a part of the polarized beam.

As follows from FIG. 2A, the apparatus contains a plurality of reflectors 13, 14, 16, 18, 20, to transmit the EUV radiation towards substrates W. Preferably, at least one of these reflectors 13, 14, 16, 18, 20 (more preferably at least several of the reflectors) reflect the extreme ultraviolet radiation, wherein the configuration is such that the reflector at least receives a p-type polarized part of the polarized radiation part, in a respective plane of incidence.

In an embodiment, the infrared radiation of the laser 130 is reflected or scattered from the same droplet 124 that generates the EUV. The infrared rays may (then) follow the same path as the EUV emission shown in FIG. 2A.

It has been found that the amount of infrared reflection on the mirrors 13, 14, 16, 18, 20, and hence the amount of infra-red propagating further into the system, depends on the polarization state at that reflection. It is expected that the polarization state will be to a large extent maintained after reflection, this is controlled by the polarization state at the starting point: the polarization of the laser 130.

An embodiment of the present aspect proposes a lithography apparatus in which the polarization state of the beam generator 130 is optimized such, that a minimum amount of infrared radiation reaches the mask table MT or wafer table WT. An optimal polarization state may depend on the orientation of the optical elements in the lithography tool as described in the following.

For example, in FIG. 2A the EUV beam (which may contain some of the infrared radiation part) is only deflected within the plane of the drawing.

If the rays shown in FIG. 2A are polarized out of the plane at the source SO (s-polarized), they are s-polarized at every reflection, whereas a ray that is p-polarized at the source remains p-polarized. In an embodiment, the reflection coefficient for p-polarized light is lower than the reflection coefficient for s-polarized light. The reflection of p-polarized visible light for example can be zero at the so-called "Brewster" angle. Also, for multi-layer mirrors coated with an anti-reflection coating the reflection coefficient of p-polarized light is lower than the reflection coefficient of s-polarized light.

In the apparatus, desirably, use is made of many reflections (for example at least five). In that case, even small differences in reflection coefficient can have large consequences. Therefore, it is expected that light from an s-polarized laser will propagate much further into the system than light from a p-polarized laser 130, and hence in this situation a p-polarized laser beam is preferred. In practice the beam may have some width out of the plane as well, but this is only a limited effect, as most of the light propagates close to the plane.

An embodiment includes one or more mirrors reflecting the whole beam out of the plane of the drawing of FIG. 2A. At such reflections, the plane of the drawing no longer coincides with the plane of incidence. At such a reflection out of the drawing's plane, light that is polarized out of that plane is actually polarized in the plane of incidence, and hence in that sense p-polarized.

In an aspect of the invention, a laser beam 128 with proper polarization direction can be obtained in several ways.

An embodiment includes application of a laser 130 with the right polarization direction (for example p-type polarization).

An embodiment includes application of physical rotation of the laser 130 to obtain the right polarization direction (for example. p-type polarization).

An embodiment includes application of one or more polarizers to polarize an unpolarized laser beam into the right polarization.

Also embodiment includes application of one or more transmissive or reflective phase retarders, to rotate the polarization, in order to obtain the right type polarized laser beam.

The preferred polarization direction may be selected from one or more of: the one that minimizes the total amount of infrared on mask MA or wafer W; the one that makes a p-polarization (with respect to the plane of incidence) on all the mirrors (as in FIG. 2A); the one that makes p-polarization on a majority of the mirrors/as large a number of mirrors as possible (if there are reflections out of the plane); the one that makes p-polarization on the first n mirrors (to eliminate IR at the beginning of the system); the one that makes p-polarization on the first AR coated mirror(s); and the one that makes p-polarization on the first grazing-incidence mirror(s).

It is noted that in this context, "mirror" may refer to any reflective optical element, including reflective spectral purity filters and reflective gratings.

Figure 20:
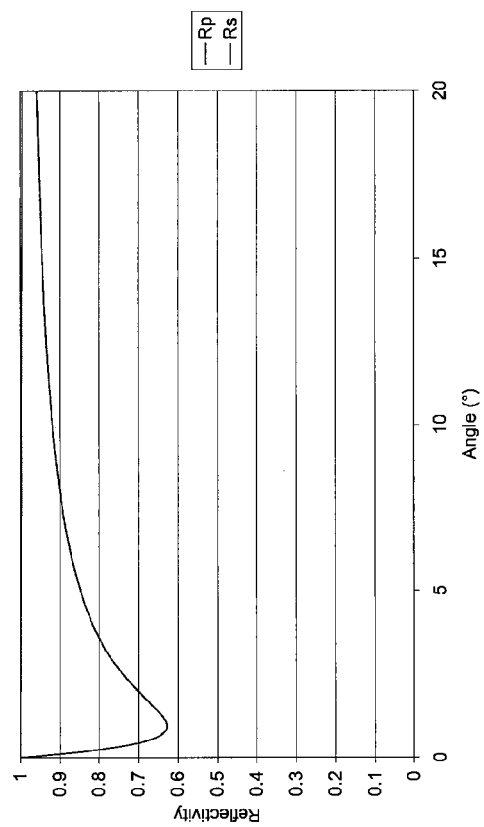
FIG. 20 is a graph showing Reflectivity of a plain Mo mirror at 10.6 μm for p-polarization (Rp) and s-polarization (Rs)

The difference in reflectivity between p- and s-polarized light is most pronounced at grazing incidence. Therefore, in a preferred embodiment, the polarization of the laser is such that the infrared radiation is mostly p-polarized on the first grazing-incidence mirror. FIG. 20 shows the reflectivity for p- and s-polarized radiation on a grazing-incidence Mo mirror. While Rs is close to 100% for all grazing angles, Rp is substantially lower, with a minimum reflectivity of only 63% at 1° grazing angle. Over a typical range of incidence angles, the average reflectivity for p-polarized radiation will be around 80-90%. Thus, the amount of IR radiation can be reduced by typically 10-20% by merely optimizing the polarization, which is generally straightforward and does not lead to any EUV losses.

Figure 21:
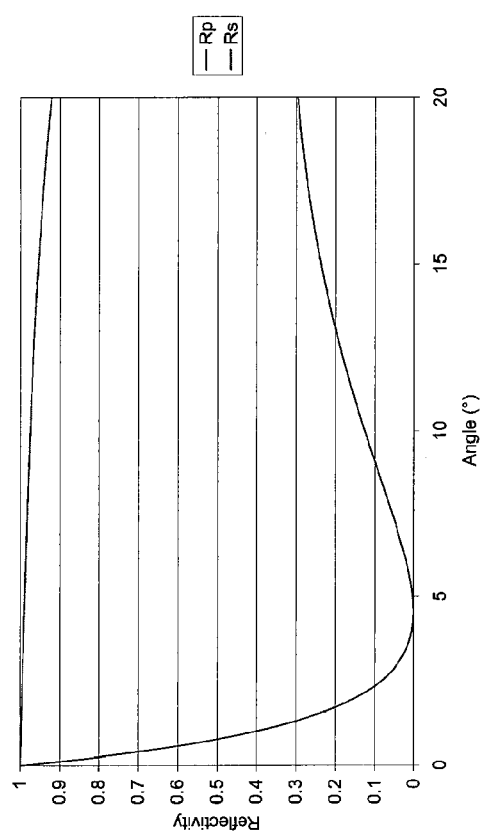
FIG. 21 is a graph showing Reflectivity of a mirror with an AR coating at 10.6 μm for p-polarization (Rp) and s-polarization (Rs).

The example above describes the effect of only one mirror. If the radiation is p-polarized for multiple grazing-incidence mirrors, the IR suppression will be enhanced accordingly. Moreover, the use of an anti-reflection coating on a grazing-incidence mirror greatly decreases the reflectivity for p-polarization at grazing angles and thus further enhances the effect of optimizing the laser beam polarization. This is illustrated in FIG. 21, showing a reflectivity of a mirror with an antireflective (AR) coating at 10.6 µm for p-polarization (Rp) and s-polarization (Rs).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the term "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it should be appreciated that modifications may be made to the present invention as described without departing from the scope of the claims set out below.

It will be appreciated that embodiments of the invention may be used for any type of EUV source, including but not limited to a discharge produced plasma source (DPP source), or a laser produced plasma source (LPP source). However, an embodiment of the invention may be particularly suited to suppress radiation from a laser source, which typically forms part of a laser produced plasma source. This is because such a plasma source often outputs secondary radiation arising from the laser.

The spectral purity filter may be located practically anywhere in the radiation path. In an embodiment, the spectral purity filter is located in a region that receives EUV-containing radiation from the EUV radiation source and delivers the EUV radiation to a suitable downstream EUV radiation optical system, wherein the radiation from the EUV radiation source is arranged to pass through the spectral purity filter prior to entering the optical system. In an embodiment, the spectral purity filter is in the EUV radiation source. In an embodiment, the spectral purity filter is in the EUV lithographic apparatus, such as in the illumination system or in the projection system. In an embodiment, the spectral purity filter is located in a radiation path after the plasma but before the collector.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), X-ray and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it should be appreciated that the present invention may be practiced otherwise than as described. For example, the present invention may take the form of a computer program containing one or more sequences of machine-readable instructions that are executable to cause an apparatus to perform a method as disclosed above, or a data storage medium (e.g. semiconductor memory, magnetic or optical disk) having such a computer program stored therein.

What is claimed is:

1. A method for manufacturing a transmissive spectral purity filter configured to transmit extreme ultraviolet radiation, the method comprising:
   providing a semiconductor substrate having a top Si layer, a bottom Si layer and an intermediate etch stop layer in between the top Si layer and the bottom Si layer;
   etching a plurality of apertures in the substrate using an anisotropic etching process, the anisotropic etching process comprising
      applying a hard mask of an aperture pattern on the substrate,
      deep reactive ion etching the aperture pattern vertically through the top Si layer to the intermediate etch layer,
      removing the bottom Si layer, and
      removing at least part of the etch stop layer to open up the plurality of apertures.

2. The method according to claim 1, wherein the etching creates textured sidewalls that define the apertures.

3. The method according to claim 2, further comprising depositing a metal or reflective layer on top of the substrate and depositing the metal or reflective layer on at least a part of each sidewall.

4. The method according to claim 1, further comprising removing all of the etch stop layer after having manufactured the apertures in the substrate.

5. A transmissive spectral purity filter configured to transmit extreme ultraviolet radiation, the transmissive spectral purity filter manufactured by the method according to claim 1, wherein the etching creates textured sidewalls that define the apertures.

6. The method according to claim 1, wherein the etch stop layer comprises $SiO_2$.

* * * * *